US012588278B2

(12) United States Patent
Tzeng et al.

(10) Patent No.: US 12,588,278 B2
(45) Date of Patent: Mar. 24, 2026

(54) SEMICONDUCTOR DEVICE HAVING DIFFERENT SIZE ACTIVE REGIONS AND METHOD OF MAKING

(71) Applicant: TAIWAN SEMICONDUCTOR MANUFACTURING COMPANY, LTD., Hsinchu (TW)

(72) Inventors: Jiann-Tyng Tzeng, Hsinchu (TW); Kam-Tou Sio, Hsinchu (TW); Shang-Wei Fang, Hsinchu (TW); Chun-Yen Lin, Hsinchu (TW); Sheng-Feng Huang, Hsinchu (TW); Yi-Kan Cheng, Hsinchu (TW); Lee-Chung Lu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 707 days.

(21) Appl. No.: 17/838,090

(22) Filed: Jun. 10, 2022

(65) Prior Publication Data

US 2023/0275090 A1      Aug. 31, 2023

Related U.S. Application Data

(60) Provisional application No. 63/268,546, filed on Feb. 25, 2022.

(51) Int. Cl.
H10D 84/85 (2025.01)
H01L 23/528 (2006.01)
(Continued)

(52) U.S. Cl.
CPC ....... *H10D 84/856* (2025.01); *H01L 23/5286* (2013.01); *H10D 30/031* (2025.01);
(Continued)

(58) Field of Classification Search
CPC ............. H10D 84/856; H10D 84/0186; H10D 84/0167; H10D 84/017; H10D 84/038;
(Continued)

(56) References Cited

U.S. PATENT DOCUMENTS 11,637,067 B2      4/2023   Doornbos
2011/0049575 A1      3/2011   Tanaka
(Continued)

FOREIGN PATENT DOCUMENTS

CN            112992854        6/2021
DE      10 2017 125 395        5/2018
(Continued)

*Primary Examiner* — Timor Karimy
(74) *Attorney, Agent, or Firm* — Hauptman Ham, LLP

(57)      ABSTRACT

A semiconductor device includes a first cell in a first row, wherein the first row extends in a first direction, the first cell having a first cell height measured in a second direction perpendicular to the first direction. The semiconductor device further includes a second cell in the first row, wherein the second cell has a second cell height measured in the second direction, the second cell height is less than the first cell height. The second cell includes a first active region having a first width measured in the second direction, and a second active region having a second width measured in the second direction, wherein the second width is different from the first width.

20 Claims, 25 Drawing Sheets

(51) Int. Cl.

| | |
|---|---|
| *H10D 30/01* | (2025.01) |
| *H10D 30/67* | (2025.01) |
| *H10D 62/10* | (2025.01) |
| *H10D 84/01* | (2025.01) |
| *H10D 84/03* | (2025.01) |

(52) U.S. Cl.
CPC ..... *H10D 30/6713* (2025.01); *H10D 30/6729* (2025.01); *H10D 30/6735* (2025.01); *H10D 30/6757* (2025.01); *H10D 62/118* (2025.01); *H10D 84/0167* (2025.01); *H10D 84/017* (2025.01); *H10D 84/0186* (2025.01); *H10D 84/0188* (2025.01); *H10D 84/038* (2025.01)

(58) Field of Classification Search
CPC ............ H10D 84/0188; H10D 62/118; H10D 30/6757; H10D 30/6713; H10D 30/6735; H10D 30/6729; H10D 30/031; H01L 23/5286
See application file for complete search history.

(56) References Cited

U.S. PATENT DOCUMENTS

| | | | |
|---|---|---|---|
| 2013/0313615 A1 | 11/2013 | Tzeng et al. | |
| 2017/0317100 A1 | 11/2017 | Kang et al. | |
| 2018/0145030 A1* | 5/2018 | Beyne ............... | H01L 21/76898 |
| 2019/0155984 A1 | 5/2019 | Chen et al. | |
| 2020/0050728 A1 | 2/2020 | Kim et al. | |
| 2020/0104446 A1 | 4/2020 | Li et al. | |
| 2020/0105752 A1* | 4/2020 | Liaw .................. | H10D 30/6757 |
| 2022/0262791 A1* | 8/2022 | Shi ....................... | H10D 62/119 |

FOREIGN PATENT DOCUMENTS

| | | |
|---|---|---|
| DE | 10 2019 127 073 | 3/2021 |
| DE | 10 2020 123 277 | 7/2021 |
| DE | 10 2020 135 005 | 10/2021 |
| DE | 10 2021 100 870 | 11/2021 |
| KR | 10-2021-0086460 | 7/2021 |
| KR | 10-2021-0139132 | 11/2021 |
| TW | 107871726 | 4/2018 |
| TW | 202145373 | 12/2021 |
| WO | 01/43198 | 6/2001 |

* cited by examiner

400A

SEMICONDUCTOR DEVICE HAVING DIFFERENT SIZE ACTIVE REGIONS AND METHOD OF MAKING

PRIORITY CLAIM AND CROSS-REFERENCE

The current application claims priority to provisional application 63/268,546 filed Feb. 25, 2022, the entire contents of which are incorporated herein by reference in their entirety.

BACKGROUND

As semiconductor sizes continue to decrease, challenges arise with respect to maintain a pace with Moore's Law. In order to assist with continued size reduction for semiconductor devices, three-dimensional (3D) integration of components within the semiconductor device is utilized, in some instances. Some 3D integration techniques include the use of back-side interconnect structures. In addition to 3D integration techniques, extreme ultraviolet (EUV) based lithography is used to pattern smaller and more densely packed elements of a semiconductor device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
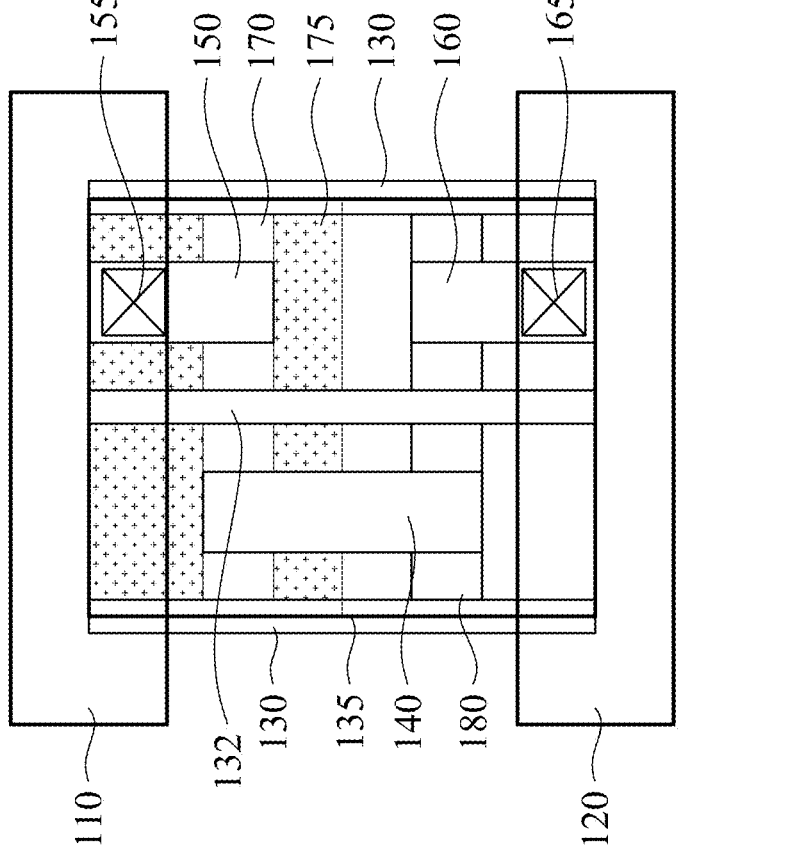
FIG. 1 is a top view of a semiconductor device in accordance with some embodiments.
Figure 1:

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Along with the decrease in size of semiconductor devices, a rise of interconnectivity of devices is increasing. In some instances, the interconnectivity of devices is called the internet of things (IoT). IoT devices have competing goals of low power consumption and high performance. This description includes a device for providing a semiconductor device that is capable of achieving both lower power consumption as well as higher performance. This combined performance is implemented using active regions that have different sizes based on design criteria for different portions of the semiconductor device. For example, a component of the semiconductor device that is designed for higher performance has a larger active region than a component of the semiconductor device for which power consumption is a higher priority than performance. As a result, the active regions for higher performance components of the semiconductor device are enlarged to achieve the designed performance results.

In some embodiments, an insulation structure is formed between a substrate and the active region. In some instances, this insulation structure is called a bottom isolation structure. The bottom isolation structure is usable to electrically separate an active region from the substrate. In comparison with other approaches that do not include the bottom isolation structure, the inclusion of the bottom isolation structure reduces or avoids a reason for doping the semiconductor substrate. Thus, the process time and resources consumed for forming wells, such as n-wells or p-wells, within the substrate are avoided for semiconductor devices that include the bottom isolation structure. According to theory and belief, the bottom isolation structure insulates the substrate from the active area without effects of a bipolar junction formed in the substrate below the active areas of the semiconductor device. According to some embodiments, the bottom isolation structure follows the outline of the source or drain region projected onto the substrate. In some embodiments, the bottom isolation structure is formed within an opening through the active area which exposes the substrate.

In some embodiments, a power fin is usable to electrically connect to a back-side interconnect structure to provide power to the semiconductor device. The power fin is usable to electrically connect a contact, such as a gate contact or a source/drain (S/D) contact on a front side of the substrate, to the back-side interconnect structure that is capable of carrying power or other signals, such as clocking signals. Inclusion of the power fin along with the bottom isolation structure helps to facilitate designing a semiconductor device that includes different sizes of active regions within a same cell. The inclusion of the power fin and bottom isolation structure also helps with cell placement in semiconductor device design by reducing spacing between adjacent cells. In some approaches that do not include the power fin or bottom isolation structure, a separation between adjacent cells in a semiconductor layout is equal to half of a cell height is used to be able to reliably manufacture the semiconductor device having the designed performance characteristics. However, by including the power fin and bottom isolation structure, the separation between adjacent cells is able to be reduced or avoided. In some embodiments, a cell height is defined based on a number of gate structures that are able to be reliably formed in the cell. In some instances, the distance between gate structures that are able to be reliably formed is called a poly pitch. Reducing or avoiding empty or "white" space within the semiconductor device design allows the semiconductor device to be formed more compactly; and therefore, in a smaller area.

Transition cells are usable between cells having different active region sizes. A transition cell includes a first active region having a first size in a first portion of the cell and a second active region having a second size in a second portion of the cell different from the first portion of the cell. The transition cells further help with developing compact semiconductor layouts with reduced white space.

Including the different sizes of active regions along with the power fin and bottom isolation structure enhances flexibility for semiconductor device designing and helps to facilitate reducing semiconductor device size while maintaining designed performance criteria.

FIG. 1 is a top view of a semiconductor device 100 in accordance with some embodiments. In some embodiments, the semiconductor device 100 has a functionality of an inverter. The use of an inverter functionality is merely exemplary for ease of understanding. One of ordinary skill in the art would understand that the semiconductor device 100 is not limited to solely an inverter functionality.

The semiconductor device 100 includes a first power rail 110 and a second power rail 120. The first power rail 110 and the second power rail 120 extend in a first direction parallel to a top surface of a substrate (not shown) of the semiconductor device 100. The semiconductor device further includes a plurality of edge gate structures 130 and a middle gate structure 132. In some instances, the edge gate structures 130 and the middle gate structure 132 are collectively called poly lines. The edge gate structures 130 and the middle gate structure 132 extend in a second direction parallel to the top surface of the substrate. The second direction is angled with respect to the first direction. In some embodiments, the second direction is perpendicular to the first direction. The semiconductor device 100 further includes a first source/drain (S/D) contact 140. The first S/D contact 140 extends in the second direction and is configured to connect to S/D regions on each of the transistors formed within the semiconductor device 100. The semiconductor device 100 further includes a second S/D contact 150. The second S/D contact 150 is electrically connected to the first power rail 110 by a via 155. The second S/D contact 150 is connected to an S/D region of a first transistor opposite a middle gate structure of the gate structures 130 from the first S/D contact 140. The semiconductor device 100 further includes a third S/D contact 160. The third S/D contact 160 is electrically connected to the second power rail 120 by a via 165. The third S/D contact 160 is connected to an S/D region of a second transistor opposite the middle gate structure of the gate structures 130 from the first S/D contact 140. The semiconductor device 100 further includes a first active region 170. The first active region 170 includes a doped region usable for defining a channel where one of the gate structures 130 cross the first active region 170; and S/D regions for receiving or transferring signals into or out of the first transistor. In some embodiments, the semiconductor device 100 further includes a doping region 175 surrounding the first active region 170. In some embodiments, the doping region 175 is the area in the first active region which received an implant of dopants to modify the voltage or switching characteristics of the transistor. The semiconductor device 100 further includes a second active region 180. The second active region 180 extends parallel to the first active region 170.

The first power rail 110 and the second power rail 120 are part of an interconnect structure. In the semiconductor device 100, the interconnect structure includes a front side interconnect structure. That is, the interconnect structure is on a same side of a substrate as active devices, such as transistors, of the semiconductor device 100. In some embodiments, the interconnect structure is on a backside of the substrate, opposite to the first side of the substrate. Each of the first power rail 110 and the second power rail 120 includes a conductive material. In some embodiments, the conductive material includes copper, aluminum, tungsten, cobalt, alloys thereof, or other suitable conductive materials. In some embodiments, the first power rail 110 is configured to carry a supply voltage, e.g., VDD. In some embodiments, the first power rail 110 is configured to carry a reference voltage, e.g., VSS. In some embodiments, the second power rail 120 is configured to carry a supply voltage, e.g., VDD. In some embodiments, the second power rail 120 is configured to carry a reference voltage, e.g., VSS. In some embodiments, the second power rail 120 is configured to carry a same voltage as the first power rail 110. In some embodiments, the second power rail 120 is configured to carry a different voltage from the first power rail 110. In some embodiments, at least one of the first power rail 110 or the second power rail 120 is in a contact metal layer, called MO or BMO in some embodiments, of the interconnect structure.

The edge gate structures 130 and middle gate structure 132 are positioned at a predefined pitch, which is determined based on a manufacturing node size of the semiconductor device 100. The semiconductor device 100 includes one middle gate structure 132 and two edge gate structures 130. One of ordinary skill in the art would understand that a different number of middle gate structures 132 or edge gate structures 130 is within the scope of this description. A cell boundary 135 is visible extending through the two edge gate structures 130. The cell boundary 135 is a border between the semiconductor device 100 having a first functionality and another semiconductor device having the first functionality or a different functionality. In some embodiments, semiconductor devices in different cells are usable to implement an overall functionality of a larger semiconductor device or integrated circuit.

The first active region 170 below the middle gate structure 132 defines a first channel region. The second active region 180 below the middle gate structure 132 defines a second channel region. In some embodiments, the first channel region and the second channel region are two-dimensional (2D) channel regions, e.g., for a semiconductor-metal-oxide (MOS) transistor. In some embodiments, the first channel region and the second channel region are three-dimensional (3D) channel regions, e.g., for a fin field effect transistor (FinFET) or a gate all around (GAA) transistor. S/D regions are located on opposite sides of the middle gate structure 132 for each of the first active region 170 and the second active region 180. In some embodiments, the edge gate structures 130 and the middle gate structure 132 surround portions of the first active region 170 and the second active region 180. In some embodiments, the edge gate structures 130 and the middle gate structure 132 contact a top surface and a sidewall of each of the first active region 170 and the second active region 180. In some embodiments, the edge gate structures 130 and the middle gate structure 132 contact a top surface of each of the first active region 170 and the second active region 180.

In some embodiments, the middle gate structure 132 includes a gate dielectric layer, such as a high-k gate dielectric layer. A high-k dielectric material has a dielectric constant, k, greater than a dielectric constant of silicon oxide. In some embodiments, the middle gate structure 132 further includes a gate electrode including a conductive material. In some embodiments, the middle gate structure 132 includes additional layers, such as work function layers, barrier layers, or other suitable layers. In some embodiments, at least one of the edge gate structures 130 has a similar structure as the middle gate structure 132. In some embodiments, the edge gate structures 130 have a different structure from the middle gate structure 132. In some embodiments, the edge gate structures 130 are dummy, or non-functional, gate structures. In some embodiments, the edge gate structures 130 include polysilicon.

The first S/D contact 140 electrically connects an S/D region of the first active region 170 with an S/D region of the second active region 180. In some embodiments, the first S/D contact 140 is formed at a same level as the first power rail 110 and the second power rail 120, e.g., the M0 layer. In some embodiments, the first S/D contact 140 is formed at a different level from at least one of the first power rail 110 or the second power rail 120. In some embodiments, the first S/D contact 140 directly contacts the S/D region of the first active region 170 and the S/D region of the second active region 180. In some embodiments, the first S/D contact 140 is electrically connected to the S/D region of the first active region 170 and the S/D region of the second active region 180 by a contact via. In some embodiments, the contact via is called an MD contact. The first S/D contact 140 includes a conductive material. In some embodiments, the first S/D contact 140 includes copper, aluminum, tungsten, cobalt, alloys thereof, or other suitable conductive material.

The second S/D contact 150 electrically connects an S/D region of the first active region 170 with the first power rail 110. The second S/D contact 140 is formed at a different level from the first power rail 110. In some embodiments, the second S/D contact 150 directly contacts the S/D region of the first active region 170. In some embodiments, the second S/D contact 150 is electrically connected to the S/D region of the first active region 170 by a contact via. The second S/D contact 150 includes a conductive material. In some embodiments, the second S/D contact 150 includes copper, aluminum, tungsten, cobalt, alloys thereof, or other suitable conductive material. In some embodiments, the first S/D contact 140 includes a same material as the second S/D contact 150. In some embodiments, the first S/D contact 140 includes a different material from the second S/D contact 150.

The via 155 electrically connects the second S/D contact 150 to the first power rail 110. The via 155 includes a conductive material. In some embodiments, the via 155 includes copper, aluminum, tungsten, cobalt, alloys thereof, or other suitable conductive material. In some embodiments, the via 155 includes a same material as the first S/D contact 140 and the second S/D contact 150. In some embodiments, the via 155 includes a different material from at least one of the first S/D contact 140 or the second S/D contact 150.

The third S/D contact 160 electrically connects an S/D region of the second active region 180 with the second power rail 120. The third S/D contact 160 is formed at a different level from the second power rail 120. In some embodiments, the third S/D contact 160 directly contacts the S/D region of the second active region 180. In some embodiments, the third S/D contact 160 is electrically connected to the S/D region of the second active region 180 by a contact via. The third S/D contact 160 includes a conductive material. In some embodiments, the third S/D contact 160 includes copper, aluminum, tungsten, cobalt, alloys thereof, or other suitable conductive material. In some embodiments, the third S/D contact 160 includes a same material as the first S/D contact 140, the second S/D contact 150, and the via 155. In some embodiments, the third S/D contact 160 includes a different material from at least one of the first S/D contact 140, the second S/D contact 150 or the via 155.

The via 165 electrically connects the third S/D contact 160 to the second power rail 120. The via 165 includes a conductive material. In some embodiments, the via 165 includes copper, aluminum, tungsten, cobalt, alloys thereof, or other suitable conductive material. In some embodiments, the via 165 includes a same material as the first S/D contact 140, the second S/D contact 150, the via 155, and the third S/D contact 160. In some embodiments, the via 165 includes a different material from at least one of the first S/D contact 140, the second S/D contact 150, the via 155, or the third S/D contact 160.

The first active region 170 includes a doped region for defining a channel region, e.g., under the middle gate structure 132, and S/D regions, e.g., on opposite sides of the middle gate structure 132. In some embodiments, the first active region 170 includes a planar region within a substrate usable for a MOS transistor. In some embodiments, the first active region 170 includes a fin structure of doped semiconductor material usable for a FinFET. In some embodiments, the first active region 170 includes one or more nano-sheets usable for a GAA transistor. In some embodiments, the first active region 170 includes a p-type dopant. In some embodiments, the first active region 170 includes an n-type dopant.

In some embodiments, a bottom isolation structure is between the first active region 170 and the substrate. In some embodiments, the first active region 170 is either in the substrate or in a semiconductor material directly contacting the substrate.

The doping region 175 is included in some embodiments of the semiconductor device 100. The doping region 175 helps to modify switching characteristics and current leakage of the semiconductor device 100. In some embodiments, doping region 175 has a dopant type suitable for semiconductor devices wherein the first active region 170 is a P-type transistor. In some embodiments, doping region 175 has a dopant type suitable for semiconductor devices wherein the first active region 170 is an N-type transistor.

The second active region 180 includes a doped region for defining a channel region, e.g., under the middle gate structure 132, and S/D regions, e.g., on opposite sides of the middle gate structure 132. In some embodiments, the second active region 180 includes a planar region within a substrate usable for a MOS transistor. In some embodiments, the second active region 180 includes a fin structure of doped semiconductor material usable for a FinFET. In some embodiments, the second active region 180 includes one or more nano-sheets usable for a GAA transistor. In some embodiments, the second active region 180 includes a p-type dopant. In some embodiments, the second active region 180 includes an n-type dopant. In some embodiments, a bottom isolation structure is between the second active region 180 and the substrate. In some embodiments, the second active region 180 is either in the substrate or in a semiconductor material directly contacting the substrate. In semiconductor device 100, a dopant type of the second active region 180 is opposite to the dopant type of the first active region 170. In some embodiments, a dopant type of the second active region 180 is a same dopant type as the first active region 170.

The semiconductor device 100 includes the first active region 170 and the second active region 180 having a uniform width, measured in the second direction, across the semiconductor device 100. In some embodiments, at least one of the first active region 170 or the second active region 180 has a non-uniform width across the semiconductor device 100. The semiconductor device 100 include the first active region 170 having a same width as the second active region 180. In some embodiments, a width of the first active region 170 is different from a width of the second active region 180. By controlling a width of the first active region 170 and a width of the second active region 180, power consumption and performance of the semiconductor device 100 are controlled. As a width of the first active region 170 or the second active region 180 increases, a speed of performance of the semiconductor device 100 increases, but a power consumption also increases. As a width of the first active region 170 or the second active region 180 decreases, power consumption of the semiconductor device 100 decreases, but a speed of performance of the semiconductor device 100 also decreases.

Selectively choosing the widths of the active regions in different cells, e.g., defined by cell boundaries 135, provides for increasing performance where a design calls for high speed performance; or reducing power consumption to avoid unnecessary loss of power. Avoiding unnecessary loss of power helps to prolong battery life in portable devices. As a result, this description provides designers with the ability to have selective increased performance while maintaining low power consumption elsewhere in a semiconductor device.

Figure 2:
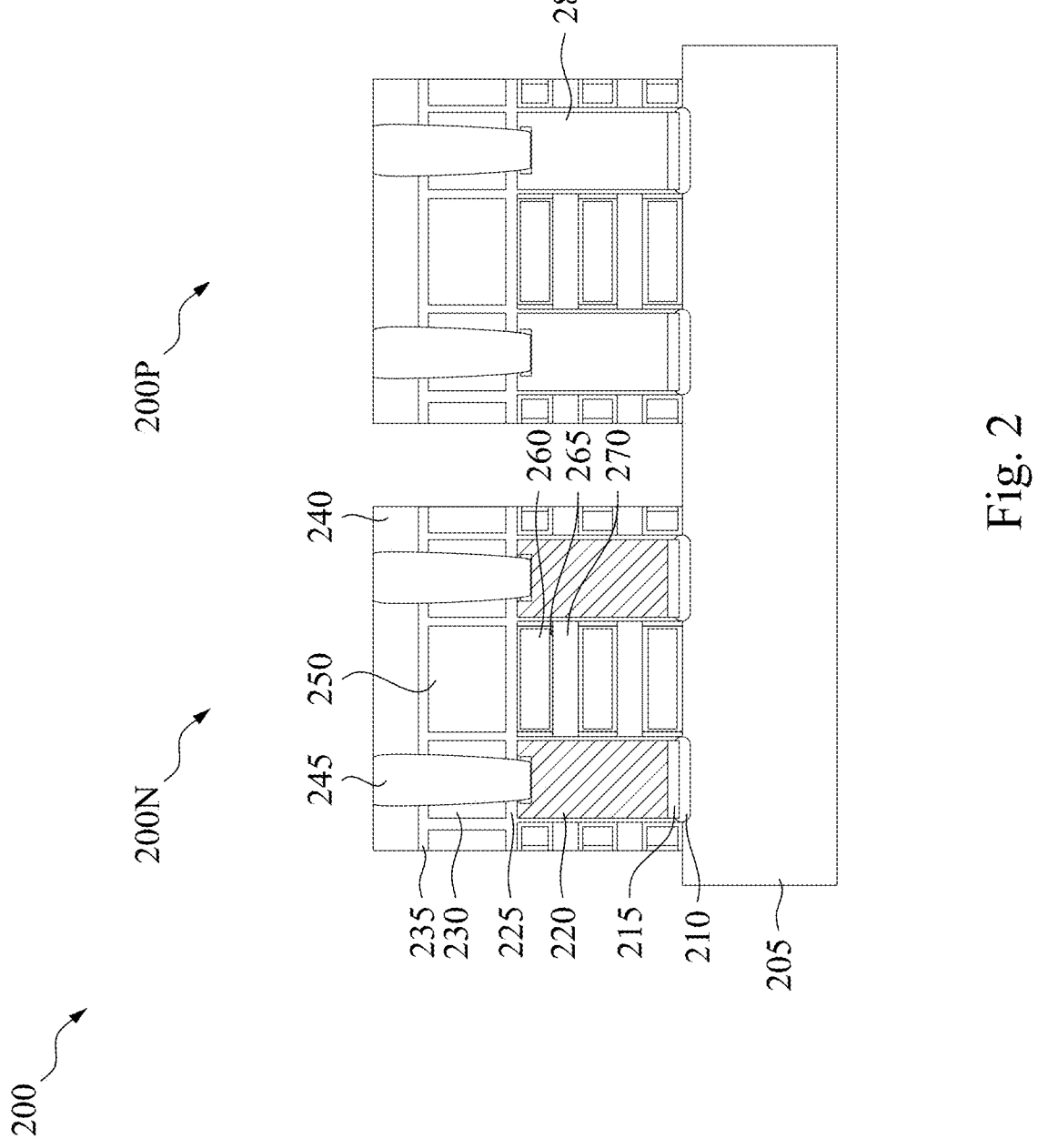
FIG. 2 is a cross-sectional view of a semiconductor device in accordance with some embodiments.

FIG. 2 is a cross-sectional view of a semiconductor device 200 in accordance with some embodiments. In some embodiments, the semiconductor device 200 is a cross-sectional view of the semiconductor device 100 (FIG. 1). In some embodiments, the semiconductor device 200 is different from the semiconductor device 100. For the sake of brevity, the description of the semiconductor device 200 focuses on portions of a first transistor structure 200N. One of ordinary skill in the art would understand that the description below is applicable to other components of the first transistor structure 200N and components of a second transistor structure 200P.

The semiconductor device 200 includes the first transistor structure 200N and the second transistor structure 200P. The first transistor structure 200N is an n-type GAA transistor. The second transistor structure 200P is a p-type GAA transistor. The semiconductor device 200 includes a substrate 205. The semiconductor device 200 further includes a bottom isolation structure 210 between the substrate 205 and a seed layer 215 associated with an S/D region 220. The bottom isolation structure 210 helps to reduce or prevent current leakage from the S/D region 220 into the substrate 205. A semiconductor device which includes a bottom isolation structure 210 allows omission of wells within the substrate below first transistor structure 200N and in the substrate below the second transistor structure 200P.

In some embodiments, the bottom isolation structure comprises a dielectric material grown from the substrate material. In some embodiments, the bottom isolation structure comprises a dielectric material deposited onto the substrate material. In some embodiments, bottom isolation structure material is grown by reacting the substrate material with water or oxygen. In some embodiments, bottom isolation structure material is deposited by atomic layer deposition (ALD), chemical vapor deposition (CVD), or another film deposition process suitable for growing dielectric materials. In some embodiments, the bottom isolation structure material comprises silicon dioxide. In some embodiments, the bottom isolation structure material comprises silicon carbide. In some embodiments, the bottom isolation structure material comprises silicon nitride or silicon oxy-nitride. In some embodiments, the bottom isolation structure material comprises a high-k dielectric material such as hafnium oxide. Manufacturing of the bottom isolation layer involves steps to promote complete coverage of the substrate by the bottom isolation layer, so that no, or little, electrical current leaks between the substrate 205 and the S/D region 220.

In some embodiments, the bottom isolation layer comprises dielectric material with a perimeter that conforms to the dimensions of the opening into which material for the S/D region is deposited in a subsequent processing step of the method 300. In some embodiments, the bottom isolation layer material is in direct contact with the sidewalls of the opening for the S/D region. In some embodiments, the bottom isolation layer partially extends below the sidewall of the opening for the S/D region in addition to being directly against the sidewalls of the opening for the S/D region. In some embodiments, the bottom isolation layer material partially extends below the sidewall of the opening for the S/D region when the bottom isolation material is formed by oxidizing the substrate material.

In some embodiments, the seed layer comprises a layer of semiconductor material suitable for growing material of the S/D region over the bottom isolation layer. In some embodiments, the seed layer material comprises polysilicon. In some embodiments, the seed layer material comprises doped polysilicon. In some embodiments, the seed layer comprises a second dielectric material, different from the bottom isolation structure material. The seed layer provides a base on which the deposition or growth of the S/D region without voids or strain due to crystal lattice mismatch between the bottom isolation material and the material of the S/D region.

In some embodiments, the seed layer is deposited by ALD, CVD, or some other suitable manufacturing process for forming the seed layer within the opening for the S/D regions in the transistor structure.

A contact etch stop layer (CESL) 225 is over the S/D region 220. A dielectric layer 230 is over the CESL 225. An etch stop layer (ESL) 235 is over the dielectric layer 230; and another dielectric layer 240 is over the ESL 235. A contact via 245 extends through the dielectric layer 240, the ESL 235, the dielectric layer 230 and the CESL 225 to electrically connect to the S/D region 220. A gate structure 250 is surrounded by the dielectric layer 230 and is between adjacent contact vias 245. The semiconductor device 200 further includes a plurality of nano-sheets 260. A dielectric layer 265 surrounds each of the plurality of nano-sheets 260. A semiconductor material 270 separates adjacent nano-sheets 260 of the plurality of nano-sheets 260. The dielectric layer 265 helps with etch selectivity during removal of the semiconductor material 270 within a channel region of the first transistor structure 200N in order to have the gate structure 250 surround the plurality of nano-sheets 260 in the channel region.

The first transistor structure 200N includes n-type doped S/D regions 220. In contrast, the second transistor structure 200P includes p-type doped S/D regions 280. Other components of the second transistor structure 200P are similar to corresponding structures of the first transistor structure 200N. In some embodiments, the S/D regions of a transistor electrically connect to the ends of the active area of the transistor (e.g., the portion of the transistor which includes the transistor channel region). In some embodiments, the S/D regions of a transistor extend around the active areas of the transistor. For example, see S/D regions 280 of FIG. 4E which extend around nano-sheets 260.

In some embodiments, substrate 205 comprises an elementary semiconductor including silicon or germanium in crystal, polycrystalline, or an amorphous structure; a compound semiconductor including silicon carbide, gallium arsenic, gallium phosphide, indium phosphide, indium arsenide, and indium antimonide; an alloy semiconductor including SiGe, GaAsP, AlInAs, AlGaAs, GaInAs, GaInP, and GaInAsP; any other suitable material; or combinations thereof. In some embodiments, the alloy semiconductor substrate has a gradient SiGe feature in which the Si and Ge composition change from one ratio at one location to another ratio at another location of the gradient SiGe feature. In some embodiments, the alloy SiGe is formed over a silicon substrate. In some embodiments, substrate 205 is a strained SiGe substrate. In some embodiments, the semiconductor substrate has a semiconductor on insulator structure, such as a silicon on insulator (SOI) structure. In some embodiments, the semiconductor substrate includes a doped epi layer or a buried layer. In some embodiments, the compound semiconductor substrate has a multilayer structure, or the substrate includes a multilayer compound semiconductor structure. In some embodiments, the substrate 205 of the semiconductor 200 is free of wells, such as n-well, p-wells, deep n-wells, or other types of wells. The inclusion of the bottom isolation structure 210 permits the avoidance of wells within the substrate 205. Therefore, a dopant concentration the substrate 205 is substantially uniform across the entire semiconductor device 200 and includes only intrinsic dopant concentrations without additional dopants added into the substrate 205, in some embodiments.

The bottom isolation structure 210 includes a dielectric material. In some embodiments, the bottom isolation structure 210 includes silicon oxide, silicon nitride, silicon carbide, silicon oxycarbide, or another suitable dielectric material. In some embodiments, the bottom isolation structure 210 is formed using a formation process, e.g., chemical vapor deposition (CVD), atomic layer deposition (ALD), thermal oxidation of the substrate, or other suitable formation processes. The bottom isolation structure 210 helps to electrically separate the S/D region 220 from the substrate 205 in the first transistor structure 200N; or the S/D region 280 from the substrate 205 in the second transistor structure 200P.

The seed layer 215 helps to facilitate growing of the S/D region 220 (or the S/D region 280) on the bottom isolation structure 210. In some embodiments, the seed layer 215 helps to allow epitaxial growth of the S/D region 220 (or the S/D region 280) by providing a layer that has a lattice structure similar to the S/D region to be grown on the seed layer. Various process parameters of a growth process (such as precursor gas, carrier gas, flow rate of the precursor and/or carrier gas, growth time, growth temperature, chamber pressure, other suitable process parameters, or combinations thereof) may be tuned to achieve the relaxed silicon layer. In some embodiments, the growth process uses a silicon-containing precursor gas, such as silane ($SiH_4$), disilane ($Si_2H_6$), trisilane ($Si_3H_8$), dichlorosilane (DCS) ($Si_2H_2Cl_2$), other suitable silicon-containing precursor gases, or combinations thereof; and a carrier gas including He, $N_2$, $H_2$, Ar, other suitable carrier gases, or combinations thereof. In some embodiments, forming the seed layer 215 includes using a DCS flow rate of about 50 sccm to about 500 sccm in an $H_2$ carrier gas, in a chamber pressure of about 5 Torr to about 100 Torr for about 50 seconds to about 1,000 minutes. In some embodiments, the growth process uses a suitable growth temperature, for example, a growth temperature of about 650° C. to about 750° C.

The S/D region 220 includes a doped epitaxial layer for electrically connecting the S/D of the first transistor structure 200N to an external element, such as a power rail or another transistor structure within the semiconductor device 200. In some embodiments, the S/D region 220 includes a same base material as the substrate 205. In some embodiments, the S/D region 220 includes different materials or compositions from the substrate 205. In some embodiments, the S/D region 220 includes a semiconductor material such as silicon or germanium; a compound semiconductor such as silicon germanium, silicon carbide, gallium arsenide, gallium phosphide, indium phosphide, indium arsenide, indium antimonide; an alloy semiconductor such as GaAsP, AlInAs, AlGaAs, InGaAs, GaInP, and/or GaInAsP; or combinations thereof.

An epitaxy process is usable to epitaxially grow S/D region 220. In some embodiments, the epitaxy process includes CVD deposition (for example, vapor-phase epitaxy (VPE), ultra-high vacuum CVD (UHV-CVD), LPCVD, and/or PECVD), molecular beam epitaxy, other suitable SEG processes, or combinations thereof. In some embodiments, the epitaxy process uses gaseous and/or liquid precursors. The S/D region 220 is doped with n-type dopants. In some embodiments, the S/D region 220 are doped with phosphorous, arsenic, other n-type dopant, or combinations thereof (for example, forming an Si:P epitaxial S/D feature, an Si:C epitaxial S/D feature, or an Si:C:P epitaxial S/D feature). In some embodiments, the S/D region 220 includes multiple epitaxial semiconductor layers, and different epitaxial semiconductor layers are different in amount of dopant included therein. In some embodiments, the S/D region 220 includes materials and/or dopants that achieve desired tensile stress and/or compressive stress in the channel regions. In some embodiments, S/D region 220 is doped during deposition by adding impurities to a source material of the epitaxy process. In some embodiments, the S/D region 220 is doped by an ion implantation process subsequent to a deposition process. In some embodiments, annealing processes are performed to form LDD regions adjacent to the S/D region 220.

The S/D region 280 is similar to the S/D region 220 except for dopant type. The S/D region 280 is doped with p-type dopants. In some embodiments, the S/D region 280 is doped with boron, boron difluoride, carbon, other p-type dopant, or combinations thereof (for example, forming an Si:Ge:B epitaxial S/D feature or an Si:Ge:C epitaxial S/D feature).

The CESL 225 is usable to provide etch selectivity relative to the dielectric layer 230 to reduce or avoid over etching and damaging the nano-sheets 260 or the S/D region 220. The CESL 225 includes a dielectric material. In some embodiments, the CESL 225 includes silicon oxide, silicon nitride, silicon oxynitride, silicon carbide, silicon oxycarbide, or another suitable dielectric material. In some embodiments, the CESL 225 is formed using CVD, ALD, physical vapor deposition (PVD), or another suitable formation process.

The dielectric layer 230 is usable to provide electrical isolation between the contact via 245 and the gate structure 250 as well as between other components of the semiconductor device 200. The dielectric layer 230 includes a dielectric material. In some embodiments, the dielectric layer 230 includes silicon oxide, silicon nitride, silicon oxynitride, silicon carbide, silicon oxycarbide, or another suitable dielectric material. In some embodiments, the dielectric layer 230 is formed using CVD, ALD, physical vapor deposition (PVD), or another suitable formation process.

The ESL 235 is usable to provide etch selectivity relative to the dielectric layer 240 to reduce or avoid over etching and damaging the dielectric layer 230. The ESL 235 includes a dielectric material. In some embodiments, the ESL 235 includes silicon oxide, silicon nitride, silicon oxynitride, silicon carbide, silicon oxycarbide, or another suitable dielectric material. In some embodiments, the ESL 235 is formed using CVD, ALD, physical vapor deposition (PVD), or another suitable formation process. In some embodiments, the ESL 235 includes a same material as the CESL 225. In some embodiments, the ESL 235 includes a different material from the CESL 225.

The dielectric layer 240 is usable to provide electrical isolation between the contact vias 245 and other components of the semiconductor device 200. The dielectric layer 240 includes a dielectric material. In some embodiments, the dielectric layer 240 includes silicon oxide, silicon nitride, silicon oxynitride, silicon carbide, silicon oxycarbide, or another suitable dielectric material. In some embodiments, the dielectric layer 240 is formed using CVD, ALD, physical vapor deposition (PVD), or another suitable formation process. In some embodiments, the dielectric layer 240 includes a same material as the dielectric layer 230. In some embodiments, the dielectric layer 240 includes a different material from the dielectric layer 230.

The contact via 245 includes a conductive material to electrically connect the S/D region 220 to other components of the semiconductor device 200. In some embodiments, the contact via 245 includes copper, aluminum, tungsten, cobalt, or another suitable conductive material. In some embodiments, a liner layer is between the conductive material and surrounding dielectric materials. In some embodiments, a silicide is between the conductive material and the S/D region 220. In some embodiments, the contact via 245 is formed using CVD, ALD, PVD, sputtering, plating, or another suitable formation process.

The gate structure 250 is configured to receive a signal to control a conductivity of a channel region of the nano-sheets 260. In some embodiments, the gate structure 250 is similar to the middle gate structure 132 (FIG. 1). In some embodiments, the gate structure 250 includes a dummy gate structure. In the channel region, the gate structure 250 wraps around each of nano-sheets 260 suspended in the channel region. In some embodiments, the gate structure 250 include multiple layers, such as a gate dielectric layer wrapping that nano-sheets 260, a gate electrode including a work function metal layer formed over the gate dielectric layer, a bulk conductive layer formed over the work function metal layer, other suitable layers, or combinations thereof. In some embodiments, the gate dielectric layer includes a high-k layer and may include one or more high-k dielectric materials (or one or more layers of high-k dielectric materials), such as hafnium silicon oxide (HfSiO), hafnium oxide (HfO$_2$), alumina (Al$_2$O$_3$), zirconium oxide (ZrO$_2$), lanthanum oxide (La$_2$O$_3$), titanium oxide (TiO$_2$), yttrium oxide (Y$_2$O$_3$), strontium titanate (SrTiO$_3$), or a combination thereof. The work function metal layer may include any suitable material, such as titanium nitride (TiN), tantalum nitride (TaN), ruthenium (Ru), molybdenum (Mo), tungsten (W), platinum (Pt), titanium (Ti), aluminum (Al), tantalum carbide (TaC), tantalum carbide nitride (TaCN), tantalum silicon nitride (TaSiN), titanium silicon nitride (TiSiN), other suitable materials, or combinations thereof. In some embodiments, the work function metal layer includes multiple material layers of the same or different types (i.e., both n-type work function metal or both p-type work function metal) in order to achieve a desired threshold voltage. In some embodiments, the bulk conductive layer includes aluminum (Al), copper (Cu), tungsten (W), cobalt (Co), ruthenium (Ru), other suitable conductive materials, or combinations thereof. In some embodiments, the gate structure 250 includes other material layers, such as a barrier layer, a glue layer, a hard mask layer, and/or a capping layer. The various layers of metal gate structure 250 are formed by any suitable method, such as CVD, ALD, PVD, plating, chemical oxidation, thermal oxidation, other suitable methods, or combinations thereof.

The nano-sheets 260 include doped semiconductor material for defining a channel region for the first transistor structure 200N. In some embodiments, the nano-sheets are similar to the first active region 170 or the second active region 180 (FIG. 1). The semiconductor device 200 includes alternating semiconductor layers, such as nano-sheets 260 including a first semiconductor material and semiconductor material 270 including a second semiconductor material which is different from the first semiconductor material. The different semiconductor materials in alternating layers is for different oxidation rates and/or different etch selectivity. In some examples, nano-sheets 260 include silicon (Si), and semiconductor material 270 includes silicon germanium (SiGe). Thus, the semiconductor layer stack is arranged with alternating Si/SiGe/Si/SiGe/ . . . layers from bottom to top.

In some embodiments, the semiconductor layer stack, i.e., nano-sheets 260 and semiconductor material 270 includes semiconductor layers of the same material but with alternating constituent atomic percentages, such as semiconductor layers having a constituent of a first atomic percent and semiconductor layers having the constituent of a second atomic percent. In some embodiments, the semiconductor layer stack includes silicon germanium layers having alternating silicon and/or germanium atomic percentages (for example, $Si_aGe_b/Si_cGe_d/Si_aGe_b/Si_cGe_d$ from bottom to top, where a and c are different atomic percentages of silicon and b and d are different atomic percentages of germanium). In some embodiments, the alternating material layers in the semiconductor layer stack include other materials such as germanium, a compound semiconductor such as silicon carbide, gallium arsenide, gallium phosphide, indium phosphide, indium arsenide, and/or indium antimonide, an alloy semiconductor such as GaAsP, AlInAs, AlGaAs, InGaAs, GaInP, and/or GaInAsP, or combinations thereof.

In some other embodiments, nano-sheets 260 are doped with a p-type dopant such as boron or boron compound (B, $^{11}B$ or $BF_2$), aluminum (Al), indium (In), gallium (Ga), or combinations thereof for a p-type channel, or an n-type dopant such as phosphorus (P, $^{31}P$), arsenic (As), antimony (Sb), or combinations thereof for an n-type channel. In some embodiments, semiconductor material 270 includes SiGe with about 20-40% germanium (Ge) in molar ratio. For example, the semiconductor material 270 includes SiGe with about 25% of Ge in molar ratio. In some embodiments, one nano-sheet 260 includes a different composition from another nano-sheet 260.

A number of the total nano-sheets depends on design of the semiconductor device 200. For example, in some embodiments, the number of nano-sheets 260 ranges from three to ten. In some embodiments, all of the nano-sheets 260 have the same thickness. In some other embodiments, one nano-sheet 260 has a different thickness form another nano-sheet 260.

The dielectric layer 265 provides electrical isolation for the nano-sheets 260. In some embodiments, the dielectric layer 265 functions as a spacer for the nano-sheets 260. In some embodiments, the dielectric layer 265 includes silicon oxide, silicon nitride, silicon oxynitride, silicon carbide, silicon oxycarbide, or another suitable dielectric material. In some embodiments, the dielectric layer 265 is formed using CVD, ALD, physical vapor deposition (PVD), or another suitable formation process. In some embodiments, the dielectric layer 265 includes a same material as the dielectric layer 230 and dielectric layer 240. In some embodiments, the dielectric layer 265 includes a different material from at least one of the dielectric layer 230 or the dielectric layer 240.

By controlling a width of the nano-sheets 260, power consumption and performance of the semiconductor device 200 are controlled. Selectively choosing the size of the nano-sheets 260 in different cells enables increased performance where a design calls for high speed performance; or reduced power consumption to avoid unnecessary loss of power. Avoiding unnecessary loss of power helps to prolong battery life in portable devices. As a result, this description provides designers with the ability to have selective increased performance while maintaining low power consumption elsewhere in a semiconductor device.

Figure 3:
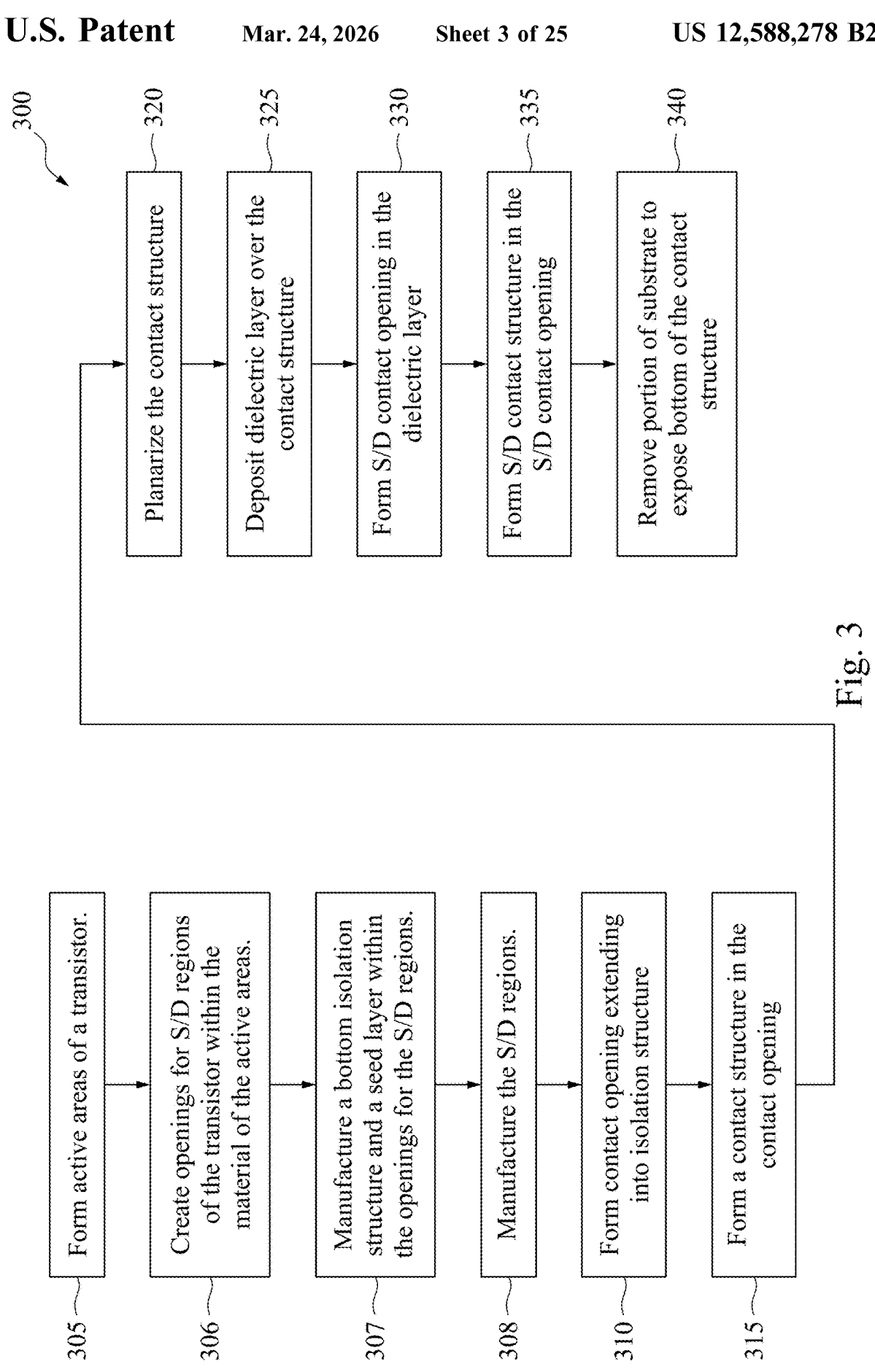
FIG. 3 is a flowchart of a method of manufacturing a semiconductor device in accordance with some embodiments.

FIG. 3 is a flowchart of a method 300 of manufacturing a semiconductor device in accordance with some embodiments. In some embodiments, the method 300 is usable to produce the semiconductor device 100 (FIG. 1) or the semiconductor device 200 (FIG. 2). In some embodiments, the method 300 is usable to produce a semiconductor device other than the semiconductor device 100 (FIG. 1) or the semiconductor device 200 (FIG. 2). Using the method 300, a semiconductor device including a contact structure for electrically connecting an active device on a front side of a substrate to a backside of the substrate. In some embodiments, the contact structure is electrically connected to a power structure on the backside of the substrate. In some embodiments, the contact structure is electrically connected to a clocking structure on the backside of the substrate. In some embodiments, the contact structure is electrically connected to a different type of interconnect structure from a power or clocking structure on the backside of the substrate.

In operation 305 gate structures or active areas of a transistor structure are formed on the front side of the substrate. The gate structures or active areas of the transistor structure are formed using a series of deposition, lithography, and etching processes. In some embodiments, the transistor structure includes a MOS transistor structure. In some embodiments, the transistor structure includes a Fin-FET structure. In some embodiments, the transistor structure includes a GAA transistor structure. In some embodiments, the gate structure includes a high-k metal gate structure. In some embodiments, the gate structure includes polysilicon. In some embodiments, the gate structure includes an active gate structure, i.e., a gate structure capable of adjusting a conductivity of a channel region. In some embodiments, the gate structure includes a dummy gate structure, i.e., a non-operational gate structure. In some embodiments, the plurality of S/D regions includes an epitaxial material. In some embodiments, the plurality of S/D regions includes a highly doped region.

In some embodiments, the operation 305 further includes deposition of a CESL over the plurality of S/D regions. In some embodiments, the operation 305 further includes forming a dielectric layer, such as an inter-layer dielectric (ILD) over the CESL. In some embodiments, the operation 305 further includes a planarization process to flatten a top surface of the ILD and the gate structure. In some embodiments, the planarization process includes a chemical mechanical polishing (CMP) process. In some embodiments, the planarization process includes a grinding process.

Figure 4A:
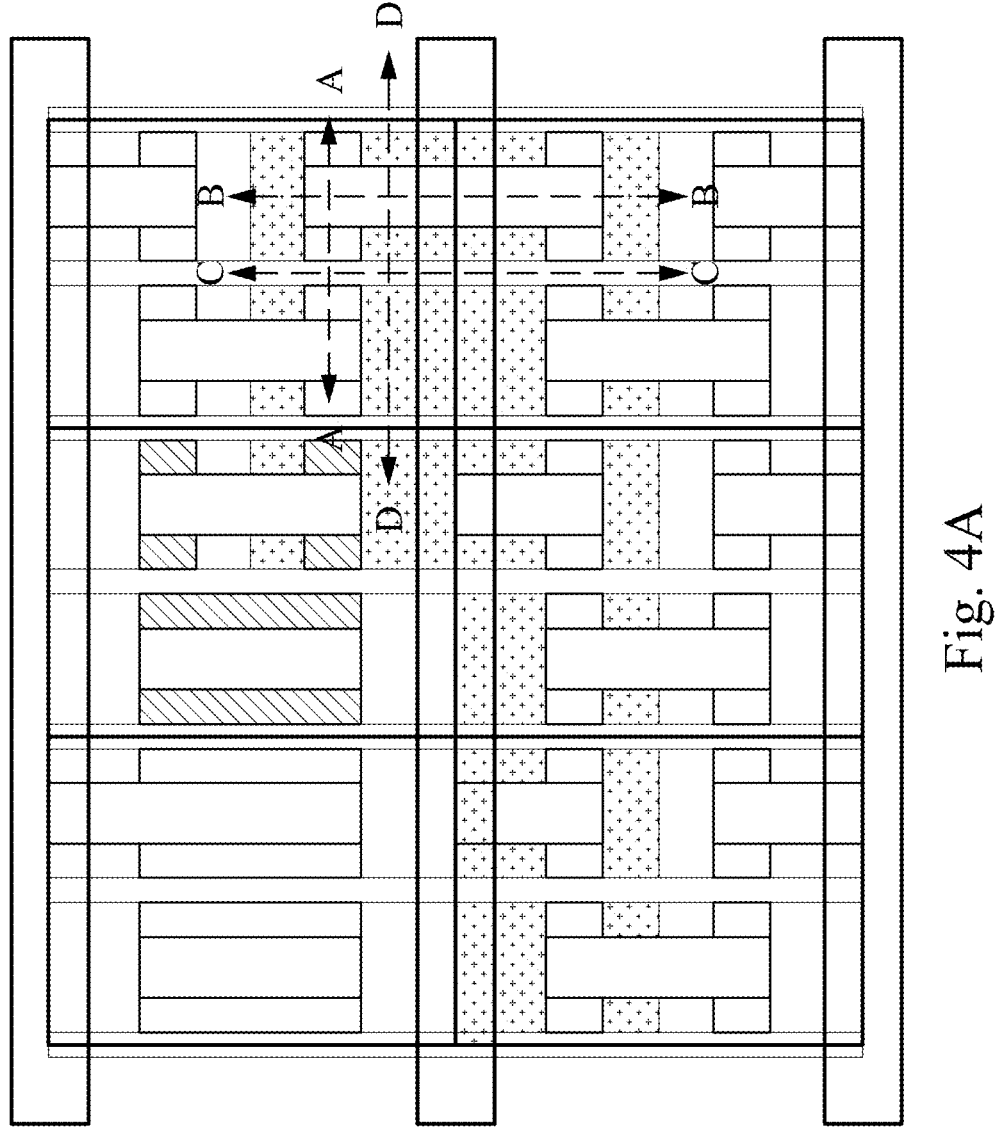
FIG. 4A is a top view of a semiconductor device in accordance with some embodiments.
Figure 4A:

FIG. 4A is a top view of a semiconductor device 400A in accordance with some embodiments. In some embodiments, the semiconductor device 400A is produced using the method 300 (FIG. 3). In some embodiments, the semiconductor device 400A is produced using a method different from the method 300 (FIG. 3). The semiconductor device 400A is a top view of a device after formation of contact structures through a substrate; and after formation of S/D contact structures. Details of the semiconductor device 400A are explained with respect to FIGS. 4B-4N below. FIGS. 4B-4N are cross-sectional views taken along one of line A-A, B-B, or C-C of semiconductor device 400A. The cross-sectional view for each of FIGS. 4B-4N will be identified in the description of the corresponding drawing.

Figure 4C:
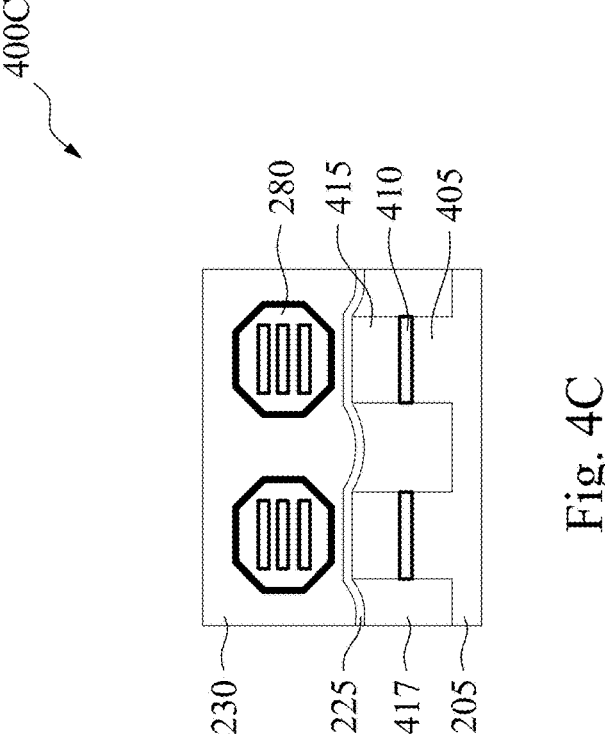
FIGS. 4B-4N are cross-sectional views of a semiconductor device taken along different cross-sections of the semiconductor device in FIG. 4A at various stages of manufacture in accordance with some embodiments.
Figure 4B:
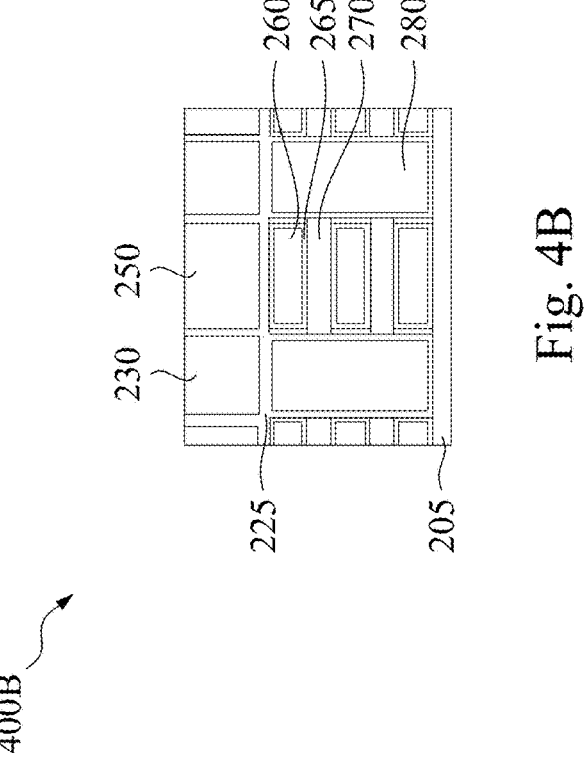

FIG. 4B is a cross-sectional view of a semiconductor device 400B taken along line A-A in FIG. 4A during a manufacturing process in accordance with some embodiments. In some embodiments, the semiconductor device 400B is a structure following the operation 305 (FIG. 3). In some embodiments, the semiconductor device 400B is a structure following a different operation from the operation 305 (FIG. 3). The semiconductor device 400B is similar to the semiconductor device 200 (FIG. 2) and similar elements have a same reference number.

The semiconductor device 400B includes the substrate 205. While not clearly visible in FIG. 4B, the semiconductor device 400B includes the bottom isolation structure, e.g., the bottom isolation structure 210 of FIG. 2. The S/D region 280 is over the substrate 205. The CESL 225 is over the S/D region 280. The dielectric layer 230 is over the CESL 225. The gate structure 250 is surrounded by the dielectric layer 230. A top surface of the gate structure 250 is substantially co-planar with a top surface of the dielectric layer 230. Substantially co-planar means that the top surfaces are co-planar within a degree of manufacturing tolerance, e.g., due to dishing or process variation. The semiconductor device 400B further includes the plurality of nano-sheets 260. The dielectric layer 265 surrounds each of the plurality of nano-sheets 260. The semiconductor material 270 separates adjacent nano-sheets 260 of the plurality of nano-sheets 260.

FIG. 4C is a cross-sectional view of a semiconductor device 400C taken along line B-B in FIG. 4A during a manufacturing process in accordance with some embodiments. In some embodiments, the semiconductor device 400C is a structure following the operation 305 (FIG. 3). In some embodiments, the semiconductor device 400C is a structure following a different operation from the operation 305 (FIG. 3). The semiconductor device 400C is similar to the semiconductor device 200 (FIG. 2) and similar elements have a same reference number.

The semiconductor device 400C includes the substrate 205 and a fin structure including portions 405, 410 and 415 over the substrate. A lower portion 405 of the fin structure includes a first semiconductor composition. A middle portion 410 of the fin structure includes a second semiconductor composition, different from the first semiconductor composition. A top portion 415 of the fin structure includes the first semiconductor composition. In some embodiments, the first semiconductor composition is a same composition as the substrate 205. In some embodiments, the first semiconductor composition includes silicon. In some embodiments, the second semiconductor composition includes silicon germanium (SiGe). In some embodiments, semiconductor device 400C includes an isolation structure 417 between adjacent fin structures. In some embodiments, the isolation structure 417 includes a shallow trench isolation (STI) structure. In some embodiments, the isolation structure 417 includes silicon oxide, silicon nitride, silicon oxynitride, or another suitable dielectric material.

Method 300 includes an operation 306, wherein openings for the transistor S/D regions are manufactured through the active areas or gate structures of the semiconductor device. During operation 306, the openings are manufactured in such a way to expose the substrate on which the active areas have been manufactured.

In FIG. 2, in the semiconductor device 200, the openings for the S/D regions have been filled by bottom isolation structure 210, seed layer 215, and S/D region 220 for the semiconductor device 200N, and filled by bottom isolation structure 210, seed layer 215, and S/D region 280 for semiconductor device 200P.

Method 300 includes an operation 307, wherein a bottom isolation structure and a seed layer are manufactured within the S/D region openings formed during operation 306. In some embodiments, the bottom isolation structure is manufactured by oxidation of the substrate. In some embodiments, the bottom isolation structure is manufactured by deposition the bottom isolation structure material over the substrate. In some embodiments, depositing the bottom isolation structure material includes performing an ALD process, a CVD process, or some other suitable deposition process.

In FIG. 2, in the semiconductor device 200, the bottom isolation structure 210 formed by, e.g., operation 307, extends across the entire exposed surface of substrate 205 within the opening for the S/D region 220 of semiconductor device 200N.

Returning to FIG. 3, in operation 307, a seed layer is formed over the bottom isolation layer to promote manufacturing of the S/D regions of the transistor structure. In some embodiments, the seed layer is manufactured by depositing seed layer material by an ALD process. In some embodiments, the seed layer is manufactured by depositing seed layer material by a CVD process. In some embodiments, the seed layer is manufactured by depositing poly-silicon, a mixture of silicon and germanium (SiGe), or some other mixture of semiconductor materials. In some embodiments, the seed layer comprises a same material as the substrate, as described above. In some embodiments, the seed layer comprises a different material from the substrate, configured to have a crystal lattice structure which imposes strain on the S/D regions of the transistor structure.

In FIG. 2, in the semiconductor device 200, the seed layer 215 formed by, e.g., operation 307, extends across the entire exposed surface of the bottom isolation structure 210 within the opening for the S/D region 220 of semiconductor device 200N. Returning to FIG. 3, in operation 308, the S/D regions of the transistor structure are manufactured by depositing the S/D region material into the openings formed through the active areas, and over the seed layer of the transistor structure. In some embodiments, the S/D regions are manufactured by depositing semiconductor material into the openings through the transistor active areas. In some embodiments, depositing semiconductor material comprises depositing the same semiconductor material as is found in the substrate. In some embodiments, depositing semiconductor material comprises depositing a different semiconductor material than is found in the substrate. In some embodiments, depositing the semiconductor material comprises performing a CVD process to form the semiconductor material in the openings.

Returning to FIG. 3, in operation 310, a contact opening is formed in the semiconductor device. The contact opening extends into an isolation structure of the semiconductor device. In some embodiments, the contact opening is formed using a combination of lithography and etching processes. In some embodiments, the etching process includes a dry etching process. In some embodiments, the etching process includes a wet etching process. In some embodiments, the contact opening has a tapered profile. In some embodiments, sidewalls of the contact opening are substantially parallel. In some embodiments, the contact opening extends into the substrate. The contact opening does not extend through the entirety of the substrate. In some embodiments, an ESL is deposited over the dielectric layer, e.g., ILD, of the semiconductor device prior to forming the contact opening. In some embodiments, the ESL is deposited using CVD, ALD, PVD, or another suitable deposition process.

Figure 4E:
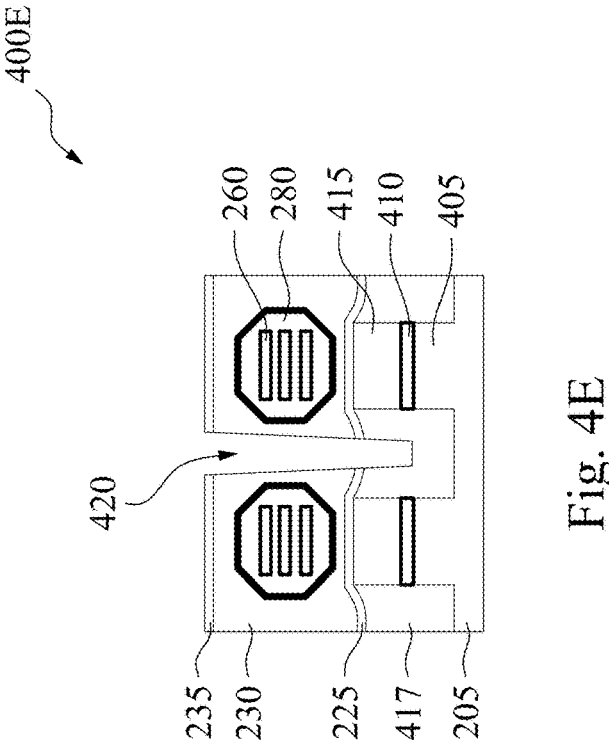
Figure 4D:
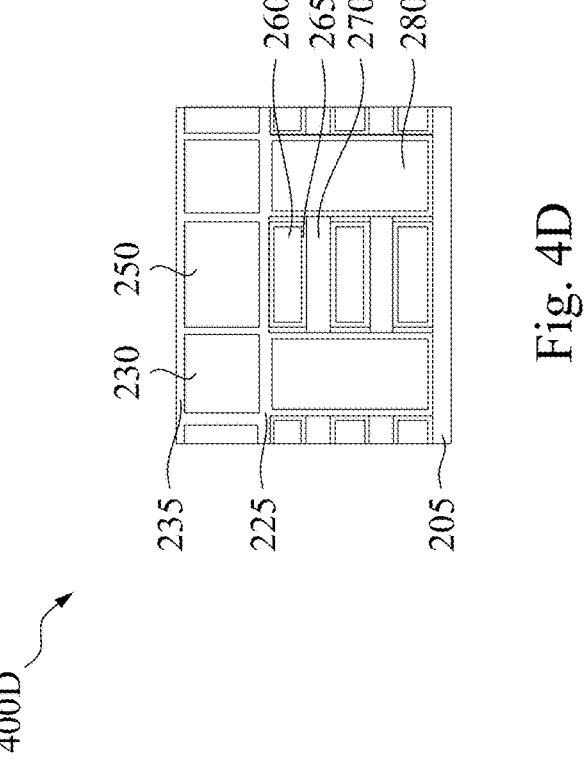

FIG. 4D is a cross-sectional view of a semiconductor device 400D taken along line A-A in FIG. 4A during a manufacturing process in accordance with some embodiments. In some embodiments, the semiconductor device 400D is a structure following the operation 310 (FIG. 3). For the sake of simplicity in the drawings, elements repeated from FIG. 4B are not labeled again. In some embodiments, the semiconductor device 400D is a structure following a different operation from the operation 310 (FIG. 3). In comparison with the semiconductor device 400B (FIG. 4B), the semiconductor device 400D includes ESL 235. The semiconductor device 400D also includes a contact opening; however, the contact opening is not visible in the cross-sectional view of FIG. 4D.

FIG. 4E is a cross-sectional view of a semiconductor device 400E taken along line B-B in FIG. 4A during a manufacturing process in accordance with some embodiments. In some embodiments, the semiconductor device 400E is a structure following the operation 310 (FIG. 3). In some embodiments, the semiconductor device 400E is a structure following a different operation from the operation 310 (FIG. 3). In comparison with the semiconductor device 400C (FIG. 4C), the semiconductor device 400E includes contact opening 420 extending through the ESL 235, the dielectric layer 230, the CESL 225, and into the isolation structure 417. The contact opening 420 does not extend into the substrate 205. In some embodiments, the contact opening 420 extends into the substrate 205.

Returning to FIG. 3, in operation 315, a contact structure is formed in the contact opening. The contact structure includes a conductive material. In some embodiments, the contact structure further includes a liner layer surrounding the conductive material. The liner layer helps to prevent or reduce diffusion of the conductive material into the surrounding dielectric materials. In some embodiments, the conductive material includes copper, aluminum, tungsten, cobalt, alloys thereof, or other suitable conductive materials. In some embodiments, the liner layer includes titanium, titanium nitride, tantalum, tantalum nitride, or other suitable materials. In some embodiments, the liner layer is deposited using CVD, ALD, or another suitable deposition process. In some embodiments, the conductive material includes nickel, tantalum, tantalum nitride, tungsten, cobalt, titanium, titanium nitride, aluminum, copper, gold, alloys thereof, or another suitable conductive material. In some embodiments, the conductive material is deposited using CVD, ALD, PVD, plating, or another suitable deposition process. In some embodiments, the conductive material extends outside of the contact structure opening.

In operation 320, the contact structure is planarized. The planarization of the contact structure causes a top surface of the contact structure to be substantially coplanar with the top surface of the gate structure. In some embodiments, planarizing the contact structure is performed using CMP, grinding, etching, or another suitable planarization process.

Figure 4G:
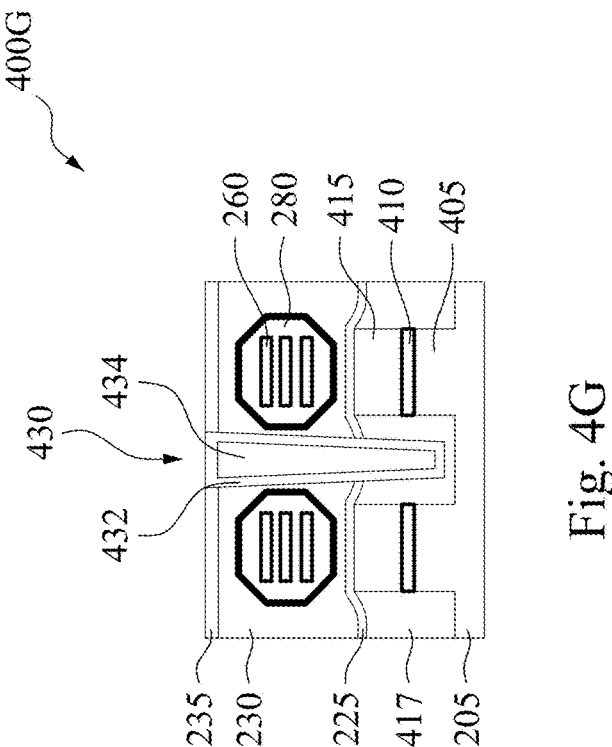
Figure 4F:
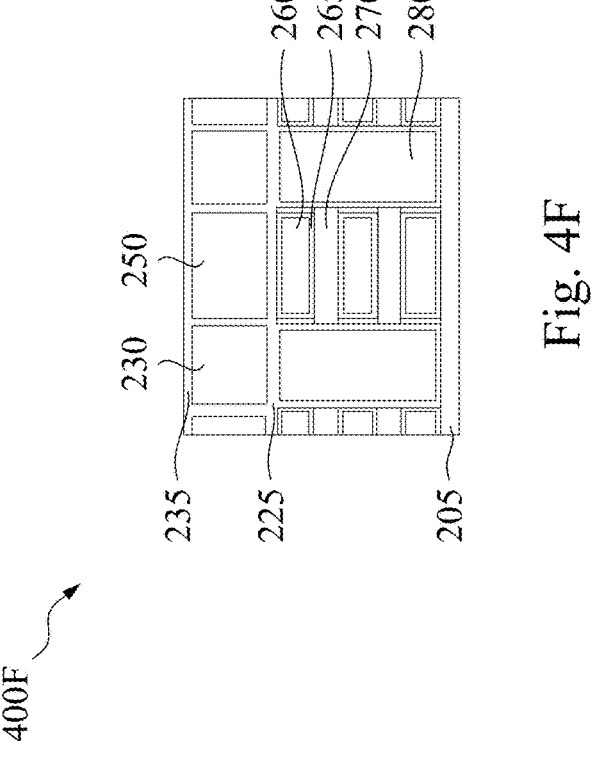

FIG. 4F is a cross-sectional view of a semiconductor device 400F taken along line A-A in FIG. 4A during a manufacturing process in accordance with some embodiments. In some embodiments, the semiconductor device 400F is a structure following the operation 320 (FIG. 3). For the sake of simplicity in the drawings, elements repeated from FIG. 4D are not labeled again. In some embodiments, the semiconductor device 400F is a structure following a different operation from the operation 320 (FIG. 3). In comparison with the semiconductor device 400D (FIG. 4D), the semiconductor device 400F includes a contact structure; however, the contact structure is not visible in the cross-sectional view of FIG. 4F.

FIG. 4G is a cross-sectional view of a semiconductor device 400G taken along line B-B in FIG. 4A during a manufacturing process in accordance with some embodiments. In some embodiments, the semiconductor device 400G is a structure following the operation 320 (FIG. 3). In some embodiments, the semiconductor device 400G is a structure following a different operation from the operation 320 (FIG. 3). For the sake of simplicity in the drawings, elements repeated from FIG. 4E are not labeled again. In comparison with the semiconductor device 400E (FIG. 4E), the semiconductor device 400G includes a contact structure 430. The contact structure 430 includes a liner layer 432 and a conductive material 434. A top surface of the contact structure 430 is substantially coplanar with the top surface of the gate structure 250.

Returning to FIG. 3, in operation 325 a dielectric layer is deposited over the contact structure. In some embodiments, the dielectric layer includes silicon oxide, silicon nitride, silicon oxynitride, or another suitable dielectric layer. In some embodiments, the dielectric layer is deposited using CVD, ALD, or another suitable deposition process.

In operation 330, an S/D contact opening is formed in the dielectric layer. The S/D contact opening exposes a portion of the S/D region of the transistor structure. In some embodiments, the process of forming the S/D contact opening removes a portion of the S/D structure. In some embodiments, the S/D contact opening is formed using a combination of lithography and etching processes. In some embodiments, the etching process is a dry etching process. In some embodiments, the etching process is a wet etching process. In some embodiments, the S/D contact opening has tapered sidewalls. In some embodiments, the S/D contact opening has substantially parallel sidewalls.

Figure 4I:
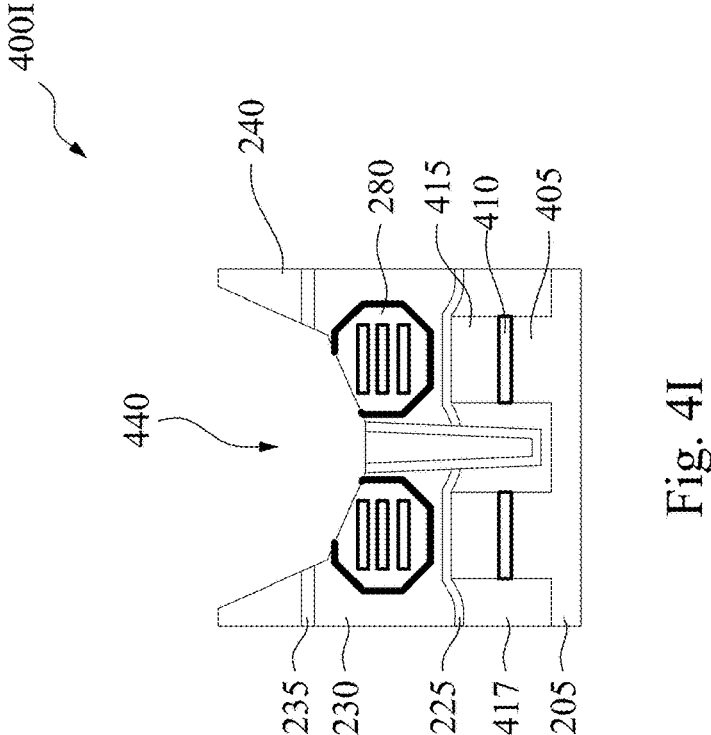
Figure 4H:
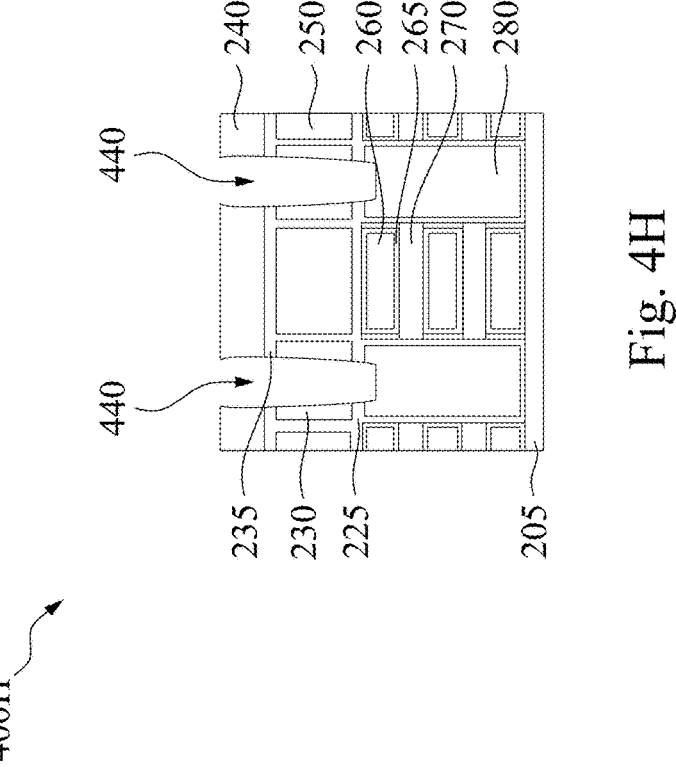

FIG. 4H is a cross-sectional view of a semiconductor device 400H taken along line A-A in FIG. 4A during a manufacturing process in accordance with some embodiments. In some embodiments, the semiconductor device 400H is a structure following the operation 330 (FIG. 3). For the sake of simplicity in the drawings, elements repeated from FIG. 4F are not labeled again. In some embodiments, the semiconductor device 400H is a structure following a different operation from the operation 330 (FIG. 3). In comparison with the semiconductor device 400F (FIG. 4F), the semiconductor device 400H includes S/D contact openings 440. The S/D contact openings 440 extend into the S/D region 280.

FIG. 4I is a cross-sectional view of a semiconductor device 400I taken along line B-B in FIG. 4A during a manufacturing process in accordance with some embodiments. In some embodiments, the semiconductor device 400I is a structure following the operation 330 (FIG. 3). In some embodiments, the semiconductor device 400I is a structure following a different operation from the operation 330 (FIG. 3). For the sake of simplicity in the drawings, elements repeated from FIG. 4G are not labeled again. In comparison with the semiconductor device 400G (FIG. 4G), the semiconductor device 400I includes the S/D contact opening 440. In comparison with FIG. 4H, the cross-sectional view in FIG. 4I has a single S/D contact opening 440 visible. The S/D contact opening 440 exposes a top surface of the contact structure 430. The S/D contact opening 440 also extends into the S/D regions 280.

Returning to FIG. 3, in operation 335, an S/D contact structure 430 is formed in the S/D contact opening. The S/D contact structure includes a conductive material. In some embodiments, the S/D contact structure further includes a liner layer surrounding the conductive material. The liner layer helps to prevent or reduce diffusion of the conductive material into the surrounding dielectric materials. In some embodiments, the conductive material includes copper, aluminum, tungsten, cobalt, alloys thereof, or other suitable conductive materials. In some embodiments, the liner layer includes titanium, titanium nitride, tantalum, tantalum nitride, or other suitable materials. In some embodiments, the liner layer is deposited using CVD, ALD, or another suitable deposition process. In some embodiments, the conductive material includes nickel, tantalum, tantalum nitride, tungsten, cobalt, titanium, titanium nitride, aluminum, copper, gold, alloys thereof, or another suitable conductive material. In some embodiments, the conductive material is deposited using CVD, ALD, PVD, plating, or another suitable deposition process. In some embodiments, the conductive material extends outside of the S/D contact structure opening. In some embodiments, the S/D contact structure is planarized. The planarization of the contact structure causes a top surface of the S/D contact structure to be substantially coplanar with the dielectric layer deposited in operation 325. In some embodiments, planarizing the S/D contact structure is performed using CMP, grinding, etching, or another suitable planarization process.

Figure 4K:
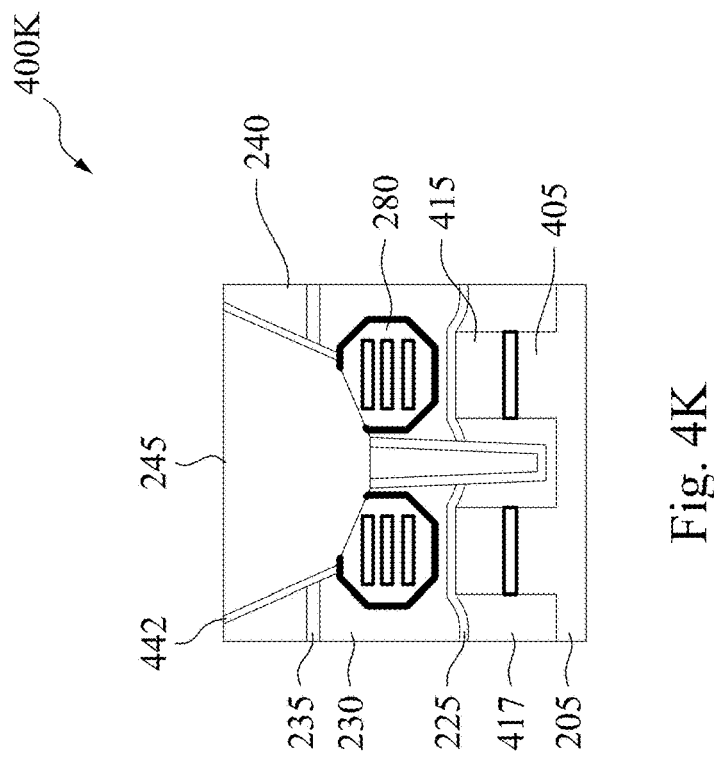
Figure 4J:
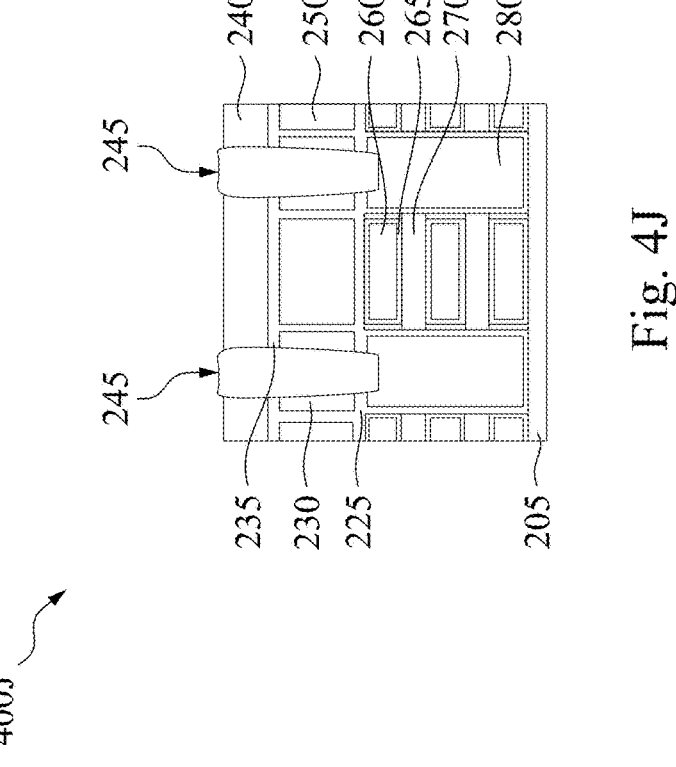

FIG. 4J is a cross-sectional view of a semiconductor device 400J taken along line A-A in FIG. 4A during a manufacturing process in accordance with some embodiments. In some embodiments, the semiconductor device 400J is a structure following the operation 335 (FIG. 3). For the sake of simplicity in the drawings, elements repeated from FIG. 4H are not labeled again. In some embodiments, the semiconductor device 400J is a structure following a different operation from the operation 335 (FIG. 3). In comparison with the semiconductor device 400H (FIG. 4H), the semiconductor device 400J includes the S/D contact 245. The S/D contact 245 is electrically connected to the S/D region 280. In some embodiments, silicide material is between the S/D region 280 and the S/D contact 245.

FIG. 4K is a cross-sectional view of a semiconductor device 400K taken along line B-B in FIG. 4A during a manufacturing process in accordance with some embodiments. In some embodiments, the semiconductor device 400K is a structure following the operation 335 (FIG. 3). In some embodiments, the semiconductor device 400K is a structure following a different operation from the operation 335 (FIG. 3). For the sake of simplicity in the drawings, elements repeated from FIG. 4I are not labeled again. In comparison with the semiconductor device 400I (FIG. 4I), the semiconductor device 400K includes the S/D contact 245. A liner layer 442 is also visible in FIG. 4K. The S/D contact 245 is electrically connected to the S/D contact structure 430 and the S/D region 280. In some embodiments, a silicide material is between the S/D contact 245 and the S/D contact structure 430.

Returning to FIG. 3, in operation 340, a portion of the substrate is removed to expose a bottom surface of the contact structure. In some embodiments where the contact structure does not extend into the substrate, an entire thickness of the substrate is removed in order to expose the bottom surface of the contact structure. In some embodiments where the contact structure does extend into the substrate, less than an entirety of the substrate is removed to expose the bottom surface of the contact structure. In some embodiments, the substrate is removed using CMP, grinding, etching, or another suitable material removal process.

Figure 4M:
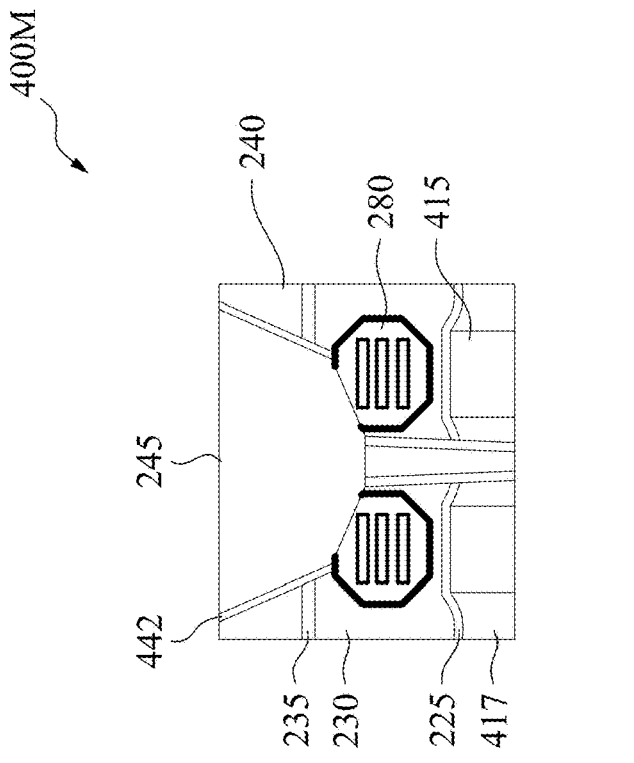
Figure 4L:
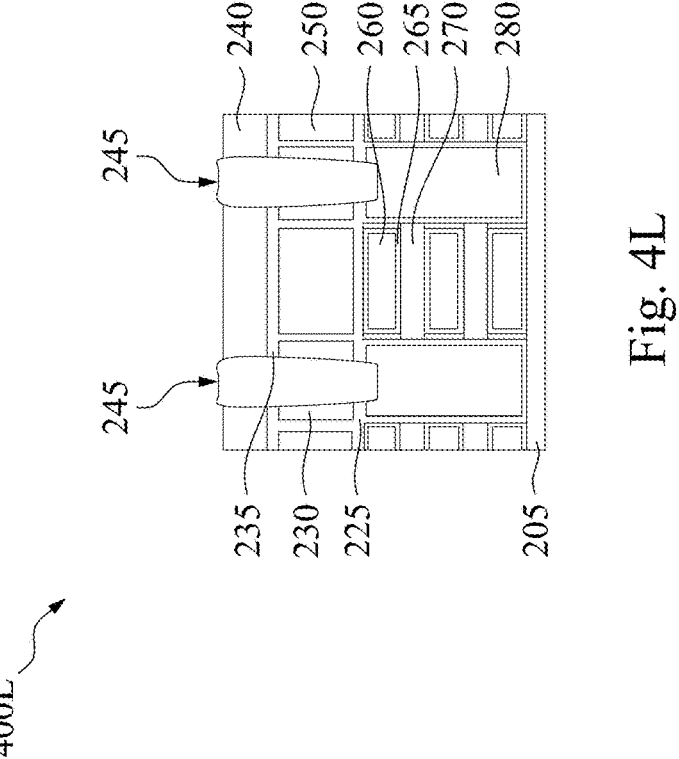

FIG. 4L is a cross-sectional view of a semiconductor device 400L taken along line A-A in FIG. 4A during a manufacturing process in accordance with some embodiments. In some embodiments, the semiconductor device 400L is a structure following the operation 340 (FIG. 3). For the sake of simplicity in the drawings, elements repeated from FIG. 4J are not labeled again. In some embodiments, the semiconductor device 400L is a structure following a different operation from the operation 340 (FIG. 3). In comparison with the semiconductor device 400J (FIG. 4J), the semiconductor device 400L does not include the substrate 205 because the substrate was removed. In some embodiments, a bottom most structure underneath the S/D region 280 is the bottom isolation structure 210. In some embodiments, the bottom most structure in the semiconductor device 400L is the S/D region 280.

FIG. 4M is a cross-sectional view of a semiconductor device 400M taken along line B-B in FIG. 4A during a manufacturing process in accordance with some embodiments. In some embodiments, the semiconductor device 400M is a structure following the operation 340 (FIG. 3). In some embodiments, the semiconductor device 400M is a structure following a different operation from the operation 340 (FIG. 3). For the sake of simplicity in the drawings, elements repeated from FIG. 4K are not labeled again. In some embodiments, in comparison with the semiconductor device 400K (FIG. 4K), the semiconductor device 400M includes a bottom surface 436 of the S/D contact structure 430 exposed by the removal of some or all of the substrate 205. According to some embodiments, partial removal of the substrate comprises forming a via opening through the substrate 205 to expose the bottom surface 436 of S/D contact structure 430. In some embodiments, removal of the substrate comprises performing a chemical mechanical polishing (CMP) processing step to planarize the back side of the semiconductor device (e.g., the side of the semiconductor device distal from the top or the opening of the S/D contact structure 430). Further, in the semiconductor device 400M, the lower portion 405 and the middle portion 410 of the fin structure were also removed. In some embodiments, the lower portion 405 or the middle portion 410 of the fin structure is not removed or is only partially removed in comparison with the semiconductor device 400K (FIG. 4K).

Figure 4N:
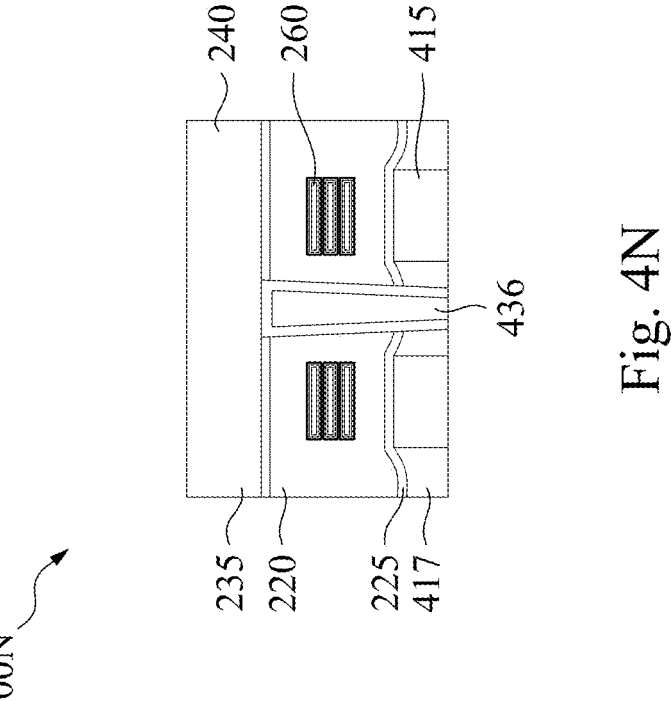

FIG. 4N is a cross-sectional view of a semiconductor device 400N taken along line C-C in FIG. 4A during a manufacturing process in accordance with some embodiments. In some embodiments, the semiconductor device 400N is a structure following the operation 340 (FIG. 3). In some embodiments, the semiconductor device 400N is a structure following a different operation from the operation 340 (FIG. 3). For the sake of simplicity in the drawings, elements repeated from FIG. 4K are not labeled again. The semiconductor device 400N includes the bottom surface 436 of the S/D contact structure 430 exposed by the removal of the substrate 205. The S/D contact structure 430 is between adjacent sets of nano-sheets 260.

Returning to FIG. 3, one of ordinary skill in the art would recognize that the method 300 includes additional operations in some embodiments. For example, in some embodiments, the method 300 includes formation of a backside interconnect structure to electrically connect to the bottom surface of the contact structure. One of ordinary skill in the art would recognize that in some embodiments, an order of operations of the method 300 is changed. For example, in some embodiments, operation 330 is performed prior to the operation 325. One of ordinary skill in the art would understand that in some embodiments at least one operation of the method 300 is omitted. For example, in some embodiments, the operation 340 is omitted and the operation 315 forms the contact opening through an entirety of the substrate. One of ordinary skill in the art would recognize that additional modifications to the method 300 are within the scope of this description.

Figure 5:
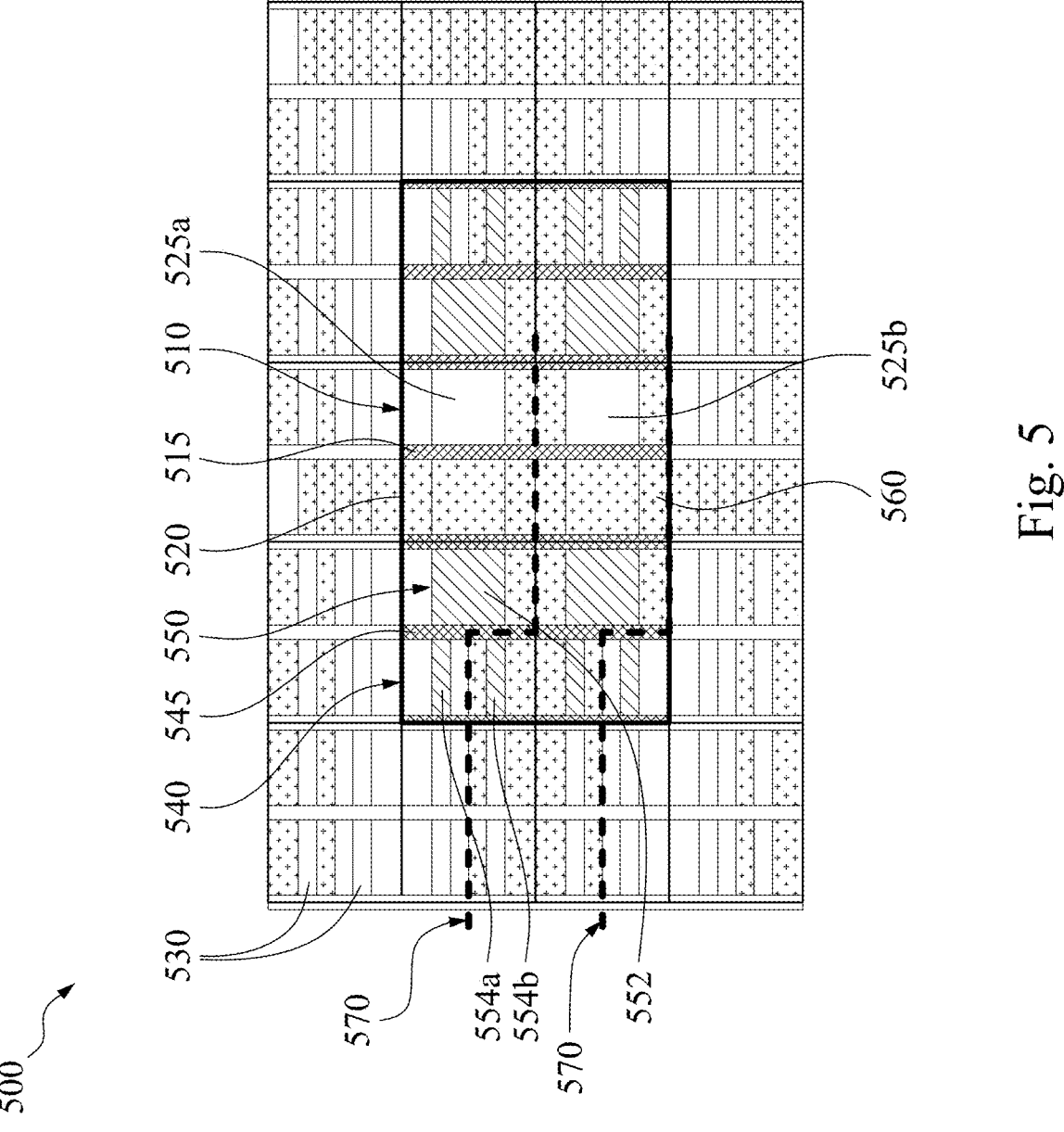
FIG. 5 is a view of a semiconductor device layout in accordance with some embodiments.

FIG. 5 is a view of a semiconductor device layout 500 in accordance with some embodiments. The semiconductor device layout 500 includes a plurality of cells. For the sake of simplicity, the description associated with the semiconductor device layout 500 is focused on two adjacent cells. The semiconductor device layout 500 includes a first cell 510. The first cell 510 includes a first active region 525a and a second active region 525*b*. Both of the first active region 525*a* and the second active region 525*b* are wider than at least some other active regions 530 in the semiconductor device layout 500. The first cell 510 further includes a gate structure 515 extending across each of the first active region 525*a* and the second active region 525*b*. The semiconductor device layout 500 further includes a second cell 540. The semiconductor device layout 500 further includes cell boundaries 520 that define borders of the first cell 510 and the second cell 540. The second cell 540 includes a gate structure 545 extending parallel to the gate structure 515. The second cell 540 further includes a transition active region 550. The transition active region 550 includes a first portion 552 having a same width as the first active region 525*a*. The transition active region 550 further includes a plurality of second portions 554*a* and 554*b* having a same width as the active region 530. The first portion 552 is on an opposite side of the gate structure 545 from the plurality of second portions 554*a* and 554*b*. The semiconductor device layout 500 further includes an optional well 560 in the substrate. Boundaries 570 of the optional well 560 are also shown as a dotted line.

A height of the second cell 540 is less than a height of the first cell 510. For example, the height of the second cell 540 is half a height of the first cell 510 because the first cell 510 includes the first active region 525*a* and the second active region 525*b*, while the second cell 540 includes the transition active region 550. A width of each of the plurality of second portions 554*a* and 554*b* is equal to a width of the active region 530. In some embodiments, the width of each of the plurality of second portions 554*a* and 554*b* is called a first active region width for the sake of simplicity. A width of each of the first active region 525*a*, the second active region 525*b*, and the first region 552 is equal to twice the width of the active region 530 plus a separation distance between adjacent active regions 530. In some embodiments, the width of each of the first active region 525*a*, the second active region 525*b*, and the first region 552 is called a second active region width for the sake of simplicity.

In some embodiments, the second cell 540 is called a transition cell because the second cell 540 provides a transition between the active region size of the first cell 510 and the size of active region 530 in other cells of the semiconductor device layout 500. Including the transition cell helps to facilitate abutment of cells, i.e., cells in direct contact with one another. In comparison, other approaches that do not include the transition cell include empty or "white" space between the first cell 510 and other cells of a layout. Including white space in the layout increases the size of the semiconductor device without enhancing performance or functionality of the semiconductor device. By avoiding the white space within the semiconductor device layout 500, the overall semiconductor device size is reduced in comparison with other approaches. For example, some approaches that do not include the transition cell include a space between a cell having wider active regions, similar to the first cell 510, and a cell including active regions having the first width, similar to active region 530, of about 5 poly pitches. A poly pitch is a distance between adjacent locations where gate structures are able to be formed in a semiconductor layout. In contrast, the semiconductor device layout 500 is able to transition from the first cell 510 to a cell including the active region 530 in only two poly pitches. The reduction of distance between the first cell 510 and cells including the active regions 530 in comparison with other approaches, reduces the overall size of the semiconductor device manufactured based on the semiconductor device layout 500.

While FIG. 5 indicates that the rectangular edges for the transition from the first region 552 to the plurality of second portions 554*a* and 554*b*, one of ordinary skill in the art would recognize that in an actual device, the corners are rounded in some embodiments. The rounding of the corners is a result of dopant diffusion as well as process variation during manufacturing of the semiconductor device.

In some embodiments, the first cell 510 is similar to the semiconductor device 100 (FIG. 1). In some embodiments, the first active region 525*a* is similar to the active region 180 (FIG. 1). In some embodiments, the second active region 525*b* is similar to the active region 170 (FIG. 1). In some embodiments, the optional well 560 is similar to the well 175 (FIG. 1). In some embodiments, the gate structure 515 is similar to the middle gate structure 132 (FIG. 1). In some embodiments, the gate structure 545 is similar to the middle gate structure 132 (FIG. 1). For the sake of simplicity of the drawings, FIG. 5 does not include contact structures and power rails. However, one of ordinary skill in the art would understand that such structures would be present in a semiconductor device manufactured based on the semiconductor device layout 500.

The dopant type in the first active region 525*a* is a same dopant type as the first region 552 and the second portions 554*a*. The dopant type of the second region 554*b* is the same dopant type as the second active region 525*b*. One of ordinary skill in the art would understand that the active regions surrounded by the optional well 560 have a first dopant type; and active regions that are not surrounded by the optional well 560 have a second dopant type opposite the first dopant type.

Figure 6:
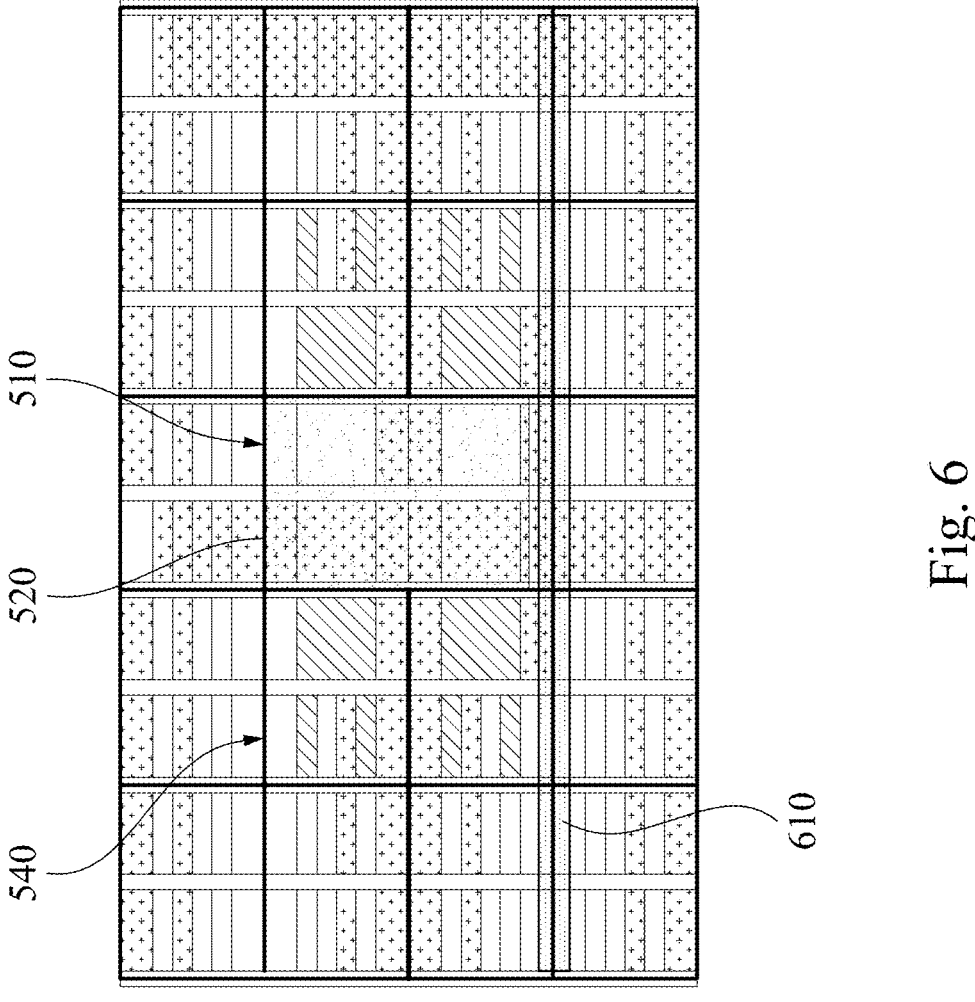
FIG. 6 is a view of a semiconductor device layout in accordance with some embodiments.
Figure 6:
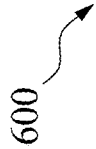

FIG. 6 is a view of a semiconductor device layout 600 in accordance with some embodiments. The semiconductor device layout 600 is similar to the semiconductor device layout 500 (FIG. 5) and similar elements have a same reference number. For the sake of simplicity some elements are not labeled. In comparison with FIG. 5, FIG. 6 includes a contact structure 610 that extends through the substrate to electrically connect a backside interconnect structure with components on a front side of the substrate. In some embodiments, the contact structure 610 is similar to the contact structure 430 (FIGS. 4G-4N). The contact structure 610 extends along cell boundaries 520. In other approaches that do not include the transition cell 540, a cell boundary of the cell including the wider active areas, similar to the first cell 510, would be offset from a cell below the cell including the wider active areas. As a result, the cell boundaries would be misaligned. The misaligned cell boundaries would cause the contact structure 610 to be discontinuous in some instances. In some instances, the misaligned cell boundaries would cause the routing to connect the contact structure 610 to components on the front side of the substrate to be more complex. As complexity of routing increases, a size of the semiconductor device also increases. Thus, including the transition cell 540, the semiconductor device layout 600 is able to define an aligned cell boundary 520 that simplifies formation of the contact structure 610 and routing for connecting the contact structure 610 to other components on the front side of the substrate.

Figure 7:
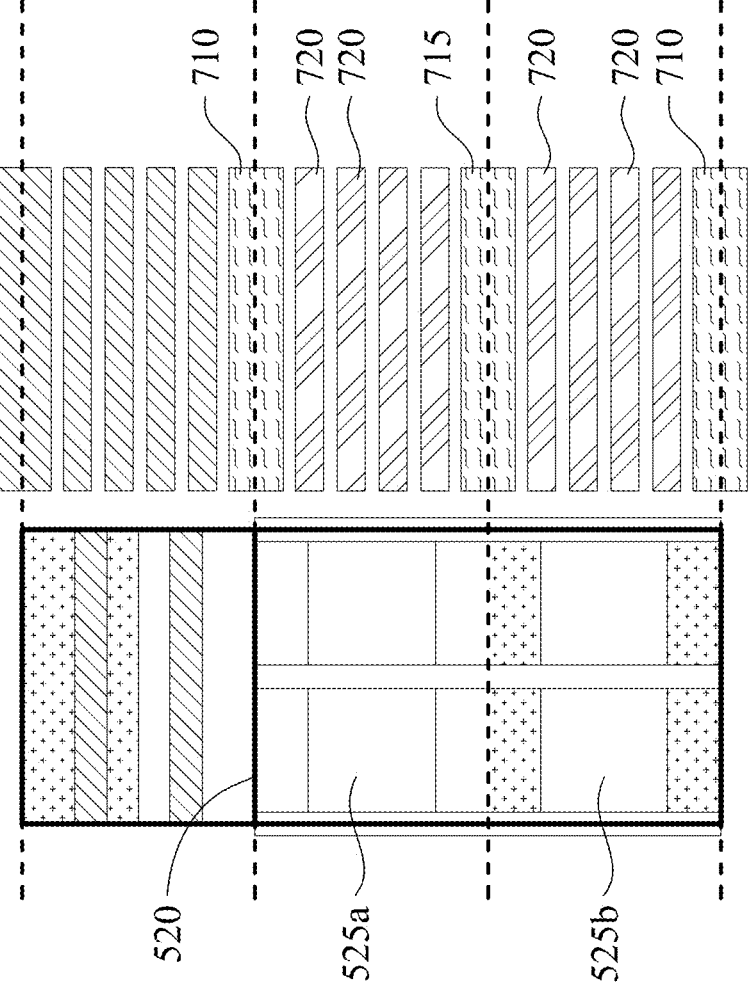
FIG. 7 is a view of a semiconductor device layout in accordance with some embodiments.
Figure 7:

FIG. 7 is a view of a semiconductor device layout 700 in accordance with some embodiments. The semiconductor device layout 700 is similar to the semiconductor device layout 500 (FIG. 5) and similar elements have a same reference number. For the sake of simplicity not all elements of the drawing are labeled. FIG. 7 includes elements 710, 715 and 720. These elements are not physical elements to be formed during manufacturing of the semiconductor device associated with the semiconductor device layout 700. Elements 710, 715 and 720 are routing tracks that indicate a location where interconnect structures, such as conductive lines or power rails are eligible to be formed. As a number of routing tracks within a layout increases, options for forming interconnect structures for routing signals within the semiconductor device increase. As the number of options for forming interconnect structures increases, a potential for increasing the size of the semiconductor device merely for the purpose of providing more interconnect routing options decreases; and a size of the semiconductor device is not increased to provide additional interconnect routing options.

The semiconductor device layout 700 includes power rail routing tracks 710. The power rail routing tracks 710 are locations extending across the semiconductor device layout 700 where a power rail is eligible to be formed. In some embodiments, the power rail routing tracks 710 are designated for a reference power rail, e.g., for carrying a VSS voltage. In some embodiments, the power rail routing tracks 710 are designated for a power supply rail, e.g., for carrying a VDD voltage. The power rail routing tracks 710 are aligned along the cell boundary 520 with the first active region 525*a* and the second active region 525*b* in between.

The semiconductor device layout 700 includes power rail routing track 715. The power rail routing track 715 is location extending across the semiconductor device layout 700 where a power rail is eligible to be formed. In some embodiments, the power rail routing track 715 is designated for a reference power rail, e.g., for carrying a VSS voltage. In some embodiments, the power rail routing track 715 is designated for a power supply rail, e.g., for carrying a VDD voltage. The power rail routing track 715 is between the first active region 525*a* and the second active region 525*b*. The power rail routing track 715 is for a power rail carrying a different signal from the power rail routing tracks 710.

The semiconductor device layout 700 includes a plurality of signal routing tracks 720. The signal routing tracks 720 extend across the semiconductor device layout 700 at locations where interconnect structures, such as conductive lines, are eligible to be formed. The interconnect structures are usable to convey signals between different components of the semiconductor device. For example, an interconnect structure is configured to electrically connect an S/D region of a first transistor to an S/D region of a second transistor. As a number of signal routing tracks 720 increases, options for forming the interconnect structures increase and a risk of increasing a size of the semiconductor device to accommodate routing options decreases.

The semiconductor device layout 700 includes eight signal routing tracks 720. While the number of signal routing tracks 720 is more or less than eight in some embodiments, other approaches that do not include the transition cell, e.g., transition cell 540 (FIG. 5), would be expected to have six signal routing tracks. The increased number of signal routing tracks 720 in the semiconductor device layout 700 helps to avoid an increase in the size of a semiconductor device manufactured using the semiconductor device layout 700 in comparison with other approaches.

Figure 8:
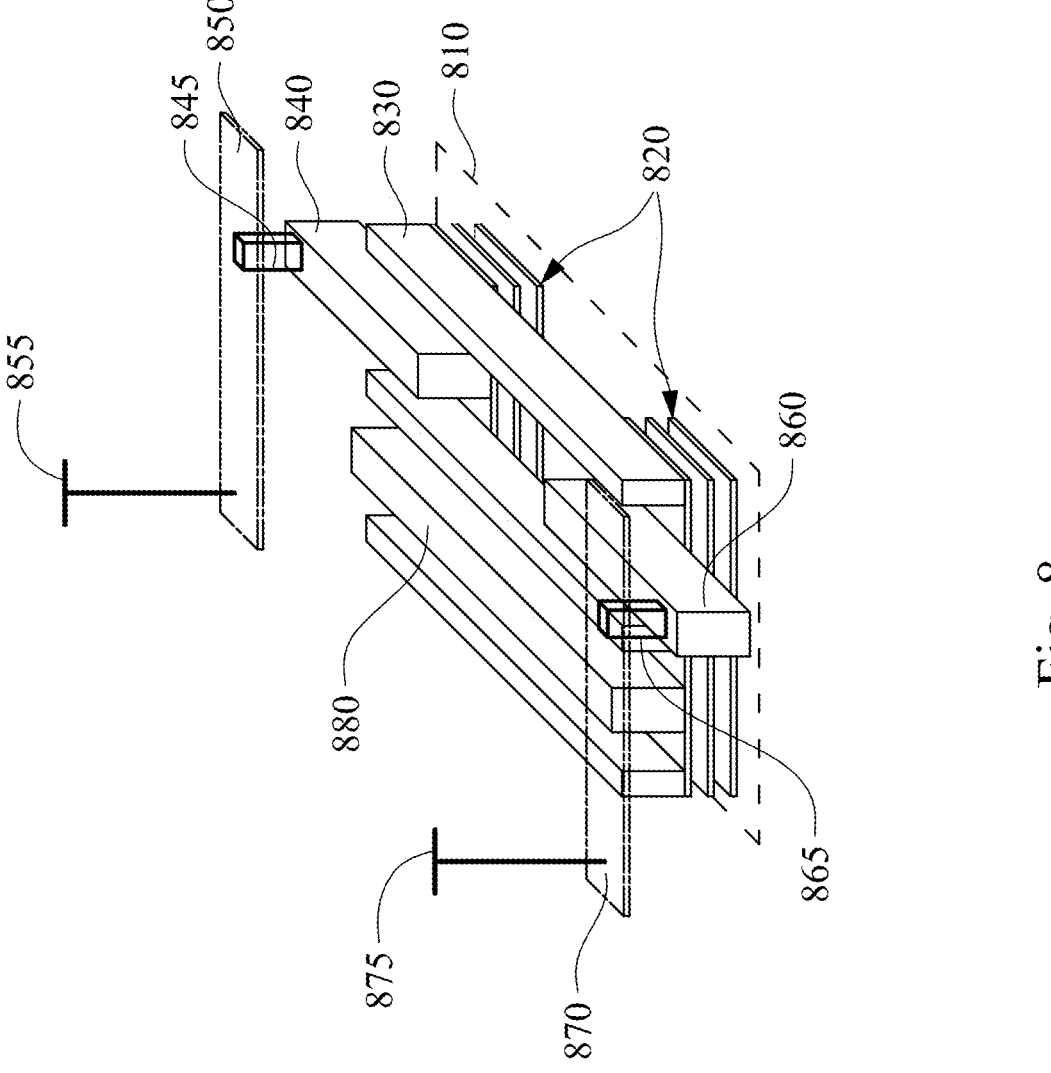
FIG. 8 is a perspective view of a semiconductor device in accordance with some embodiments.

FIG. 8 is a perspective view of a semiconductor device 800 in accordance with some embodiments. In some embodiments, the semiconductor device 800 is configured to function as an inverter. The semiconductor device 800 has a front side power delivery network (PDN). A front side PDN means that power rails 850 and 870 are on a same side of a substrate 810 as the active devices defined by the other components of the semiconductor device 800. Elements of the semiconductor device 800 are similar to elements of other semiconductor devices discussed above. The semiconductor device 800 helps to provide an understanding regarding how the semiconductor device 800 is able to utilize a front side PDN.

The semiconductor device 800 includes the substrate 810. In some embodiments, the substrate 810 is similar to the substrate 205 (FIG. 2). The semiconductor device 800 further includes a plurality of nano-sheets 820 over the substrate 810. In some embodiments, the nano-sheets 820 are similar to the nano-sheets 260 (FIG. 2). A plurality of gate structures 830 are over the nano-sheets 820. In some embodiments, the gate structures 830 are similar to the edge gate structures 130 or the middle gate structure 132 (FIG. 1). A first contact structure 840 is configured to electrically connect a first S/D region to the power rail 850 through a via 845. In some embodiments, the first contact structure 840 is similar to the contact structure 150 (FIG. 1). In some embodiments, the via 845 is similar to the via 155 (FIG. 1). In some embodiments, the power rail 850 is similar to the first power rail 110 (FIG. 1). The power rail 850 is electrically connected to a voltage source 855, e.g., VSS or VDD. A second contact structure 860 is configured to electrically connect a second S/D region to the power rail 870 through a via 865. In some embodiments, the contact structure 860 is similar to the contact structure 160 (FIG. 1). In some embodiments, the via 865 is similar to the via 165 (FIG. 1). In some embodiments, the power rail 870 is similar to the second power rail 120 (FIG. 1). The power rail 870 is electrically connected to a voltage source 875, e.g., VSS or VDD. A third contact structure 880 is configured to electrically connect a third S/D region, on an opposite side of a gate structure 830 from the first S/D region, to a fourth S/D region, on an opposite side of the gate structure 830 from the second S/D region. In some embodiments, the third contact structure 880 is similar to the contact structure 140 (FIG. 1).

Figure 9:
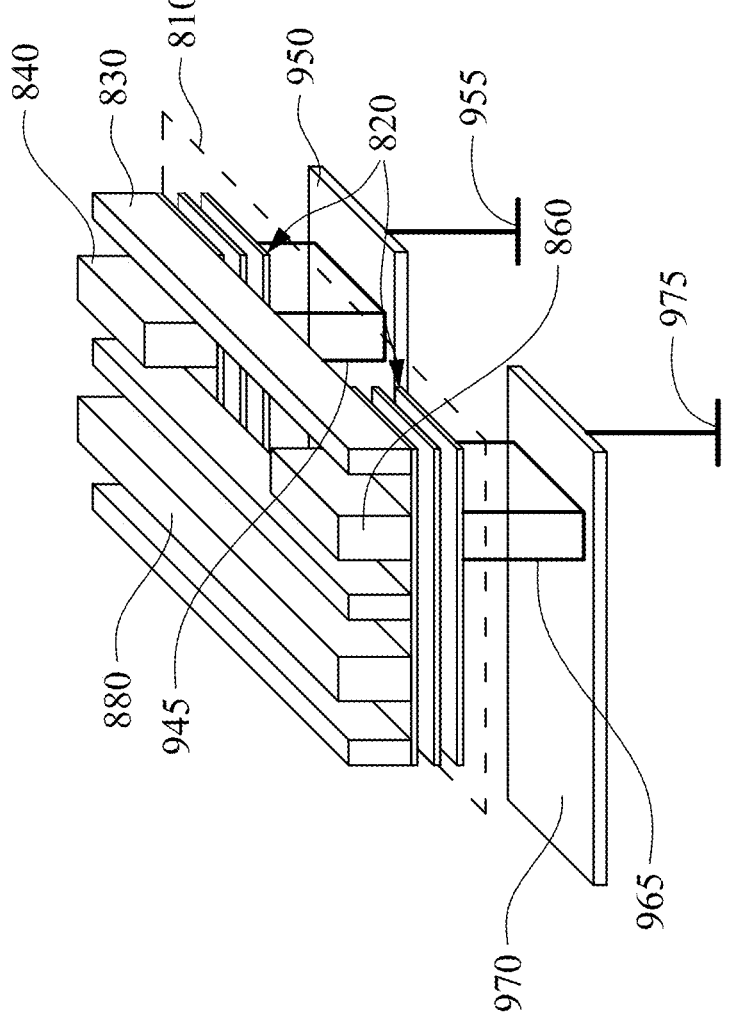
FIG. 9 is a perspective view of a semiconductor device in accordance with some embodiments.
Figure 9:
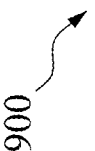

FIG. 9 is a perspective view of a semiconductor device 900 in accordance with some embodiments. In some embodiments, the semiconductor device 900 is configured to function as an inverter. The semiconductor device 900 has a backside power delivery network (PDN). A backside PDN means that power rails 950 and 970 are on an opposite side of a substrate 810 as the active devices defined by the other components of the semiconductor device 900. Elements of the semiconductor device 900 are similar to elements of semiconductor device 800 (FIG. 8) and similar elements have a same reference number. The semiconductor device 900 helps to provide an understanding regarding how the semiconductor device 900 is able to utilize a backside PDN.

In comparison with the semiconductor device 800, the semiconductor device 900 includes power rail 950 electrically connected to a first set of the nano-sheets 820 by a through via 945. The through via 945 extends through the substrate 810 to electrically connect to the first set of nano-sheets 820. In some embodiments, the through via 945 has a similar structure as the contact structure 430 (FIG. 4G-4N). In contrast to the contact structure 430, the through via 945 is connected to a bottom side (surface closest to the substrate 810) of the first set of nano-sheets 820. The power rail 950 is electrically connected to voltage source 955, e.g., VSS or VDD.

In comparison with the semiconductor device 800, the semiconductor device 900 includes power rail 970 electrically connected to a second set of the nano-sheets 820 by a through via 965. The through via 965 extends through the substrate 810 to electrically connect to the second set of nano-sheets 820. In some embodiments, the through via 965 has a similar structure as the contact structure 430 (FIG. 4G-4N). In contrast to the contact structure 430, the through via 965 is connected to a bottom side (surface closest to the substrate 810) of the second set of nano-sheets 820. The power rail 970 is electrically connected to voltage source 975, e.g., VSS or VDD.

Figure 10:
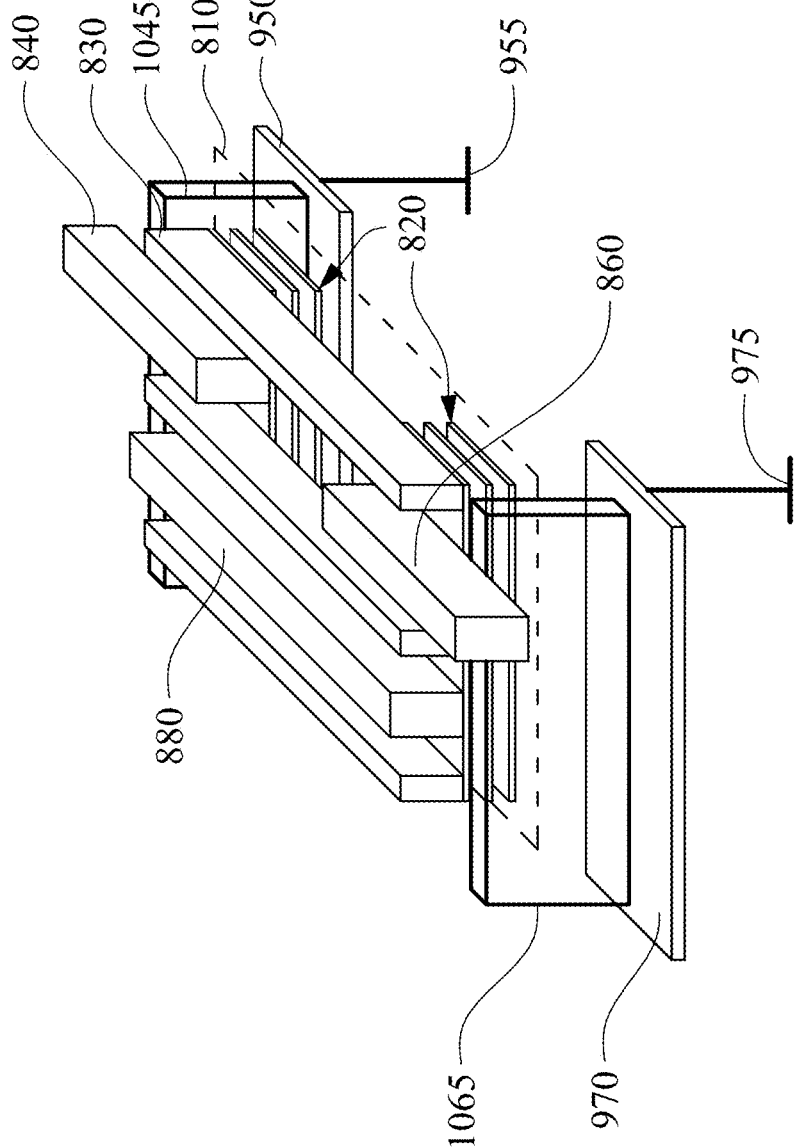
FIG. 10 is a perspective view of a semiconductor device in accordance with some embodiments.

FIG. 10 is a perspective view of a semiconductor device 1000 in accordance with some embodiments. In some embodiments, the semiconductor device 1000 is configured to function as an inverter. The semiconductor device 1000 has a backside power delivery network (PDN). Elements of the semiconductor device 1000 are similar to elements of semiconductor device 900 (FIG. 9) and similar elements have a same reference number. The semiconductor device 1000 helps to provide an understanding regarding how the semiconductor device 1000 is able to utilize a backside PDN.

In comparison with the semiconductor device 900, the semiconductor device 1000 includes power rail 950 electrically connected to a first contact 840 by a contact structure 1045. The contact structure 1045 extends through the substrate 810 to electrically connect to the first contact 840. In some embodiments, the contact structure 1045 has a similar structure as the contact structure 430 (FIG. 4G-4N).

In comparison with the semiconductor device 900, the semiconductor device 1000 includes power rail 970 electrically connected to the second contact 860 by a contact structure 1065. The contact structure 1065 extends through the substrate 810 to electrically connect to the second contact 860. In some embodiments, the contact structure 1065 has a similar structure as the contact structure 430 (FIG. 4G-4N).

In contrast with the via 945 or the via 965, the contact structure 1045 and the contact structure 1065 extend through the substrate 810 at locations along boundaries of cell instead of directly under the nano-sheets 820.

Figure 11:
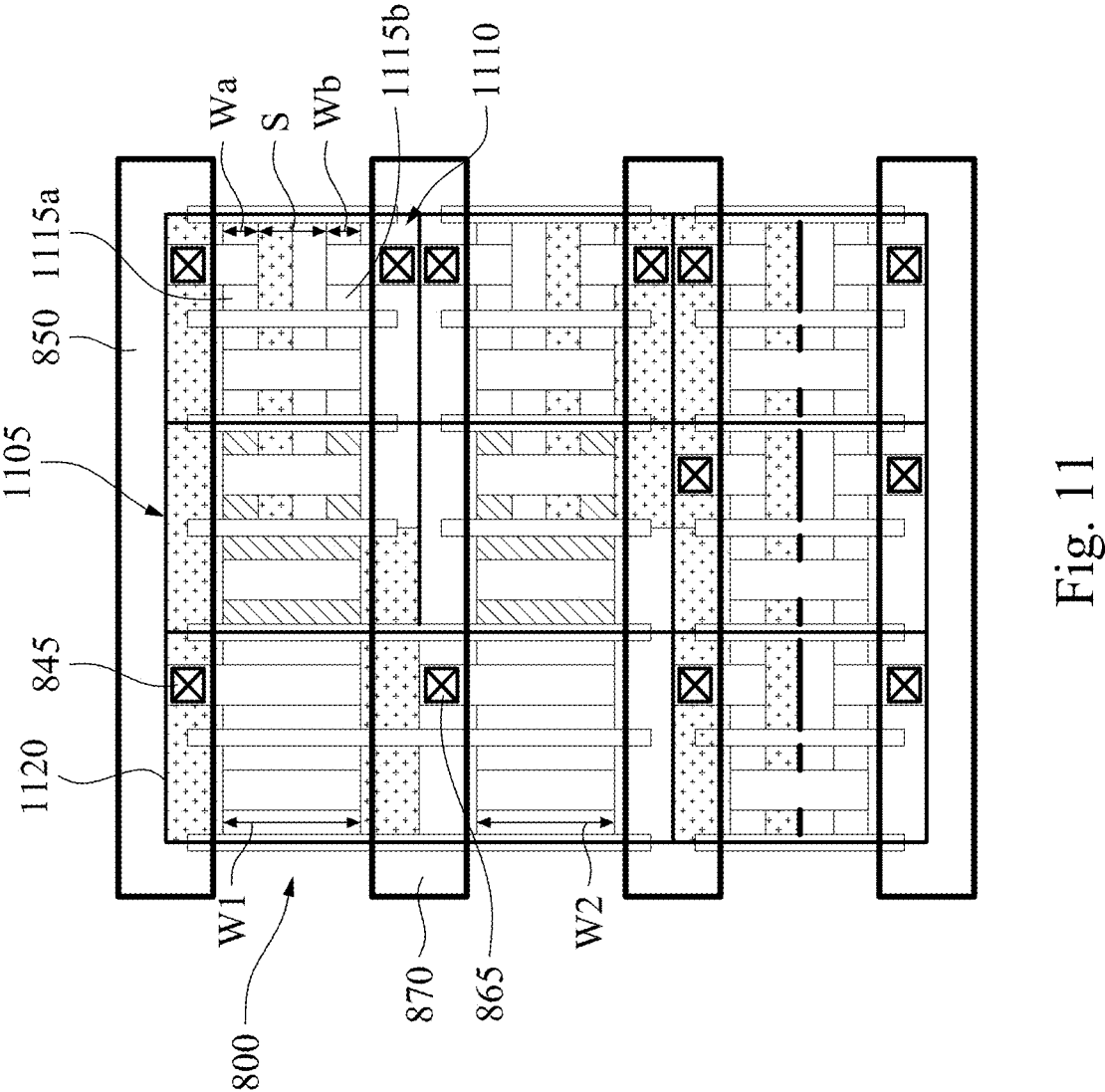
FIG. 11 is a view of a semiconductor device in accordance with some embodiments.

FIG. 11 is a view of a semiconductor device 1100 in accordance with some embodiments. The semiconductor device 1100 includes semiconductor device 800 (FIG. 8). The semiconductor device 1100 further includes other devices in addition to the semiconductor device 800. The semiconductor device 1100 includes a transition cell 1105 and a low power cell 1110. The cells within the semiconductor device 1100 are denoted by a cell boundary 1120, which one of ordinary skill in the art would recognize is not a physical structure. In some embodiments, the transition cell 1105 is similar to the transition cell 540 (FIG. 5). The semiconductor device 800 is configured to have a same functionality as the low power cell 1110. However, the semiconductor device 800 is configured to have a higher performance or larger current in comparison with the low power cell 1110. The difference in performance between the semiconductor device 800 and the low power cell 1110 is due to a size of the active regions in each of these components. By including both the semiconductor device 800 and the low power cell 1110, the semiconductor device 1100 is able to achieve both low power consumption for portions of the semiconductor device 1100 while also providing high performance in portions of the semiconductor device 1100 based on design specifications.

The low power cell 1110 includes a first active region 1115a and a second active region 1115b. The first active region 1115a has a first width Wa. The second active region 1115b has a second width Wb. The first active region 1115a is separated from the second active region 1115b by a distance S. In contrast with the low power cell 1110, the each of the active regions in the semiconductor device 800 has a width equal to a sum of the first width Wa, the second width Wb, and the separation distance S. That is, W1=W2=Wa+Wb+S.

The semiconductor device 1100 includes a front side PDN including power rails 850 and 870 located on a same side of the substrate as the transistor structures defined by the semiconductor device 800 and the low power cell 1110.

Figure 12:
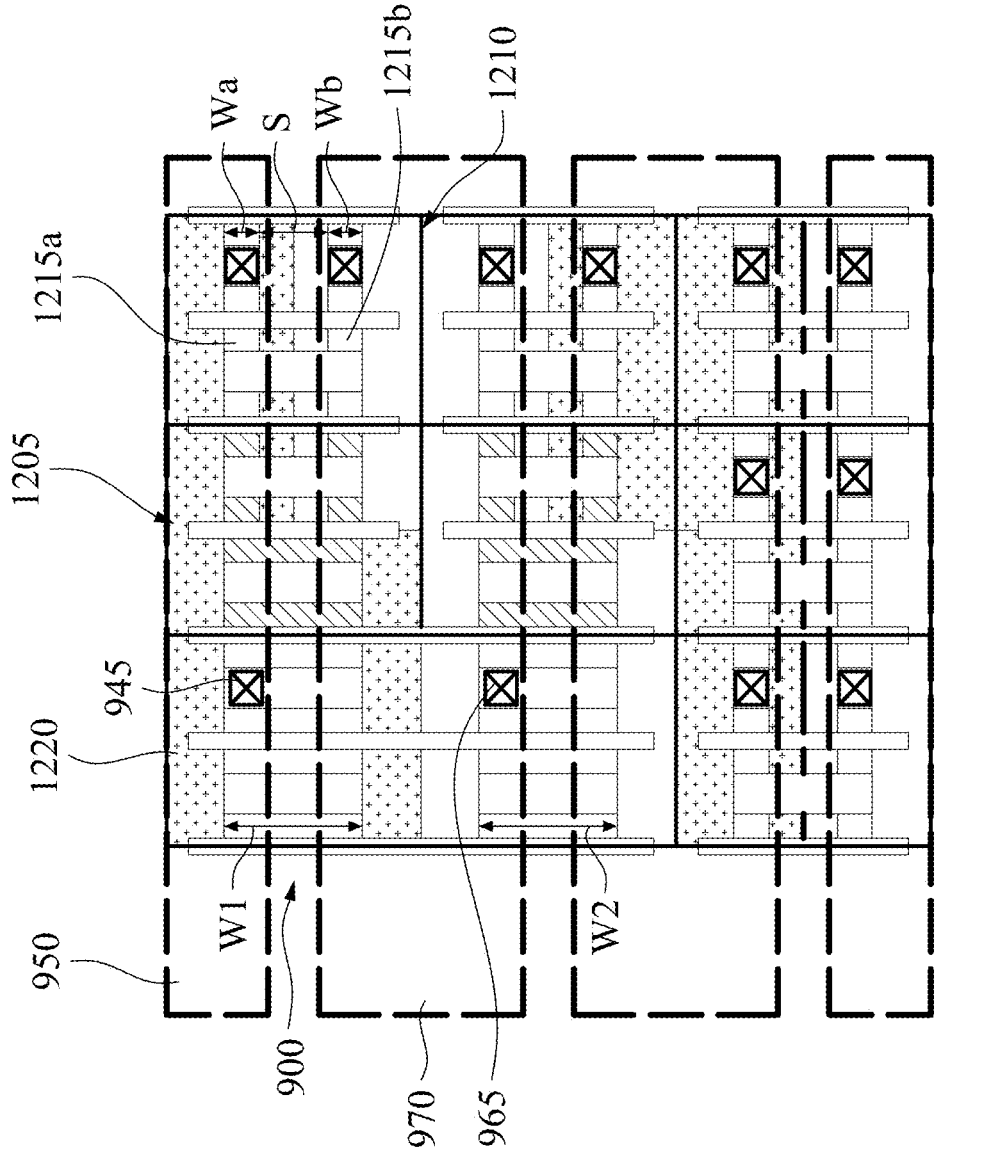
FIG. 12 is a view of a semiconductor device in accordance with some embodiments.

FIG. 12 is a view of a semiconductor device in accordance with some embodiments. The semiconductor device 1200 includes semiconductor device 900 (FIG. 9). The semiconductor device 1200 further includes other devices in addition to the semiconductor device 900. The semiconductor device 1200 includes a transition cell 1205 and a low power cell 1210. The cells within the semiconductor device 1200 are denoted by a cell boundary 1220, which one of ordinary skill in the art would recognize is not a physical structure. In some embodiments, the transition cell 1205 is similar to the transition cell 540 (FIG. 5). The semiconductor device 900 is configured to have a same functionality as the low power cell 1210. However, the semiconductor device 900 is configured to have a higher performance or larger current in comparison with the low power cell 1210. The difference in performance between the semiconductor device 900 and the low power cell 1210 is due to a size of the active regions in each of these components. By including both the semiconductor device 900 and the low power cell 1210, the semiconductor device 1200 is able to achieve both low power consumption for portions of the semiconductor device 1200 while also providing high performance in portions of the semiconductor device 1200 based on design specifications.

The low power cell 1210 includes a first active region 1215a and a second active region 1215b. The first active region 1215a has a first width Wa. The second active region 1215b has a second width Wb. The first active region 1215a is separated from the second active region 1215b by a distance S. In contrast with the low power cell 1210, the each of the active regions in the semiconductor device 900 has a width equal to a sum of the first width Wa, the second width Wb, and the separation distance S. That is, W1=W2=Wa+Wb+S.

The semiconductor device 1200 includes a backside PDN including power rails 950 and 970 located on an opposite side of the substrate from the transistor structures defined by the semiconductor device 900 and the low power cell 1210.

Figure 13:
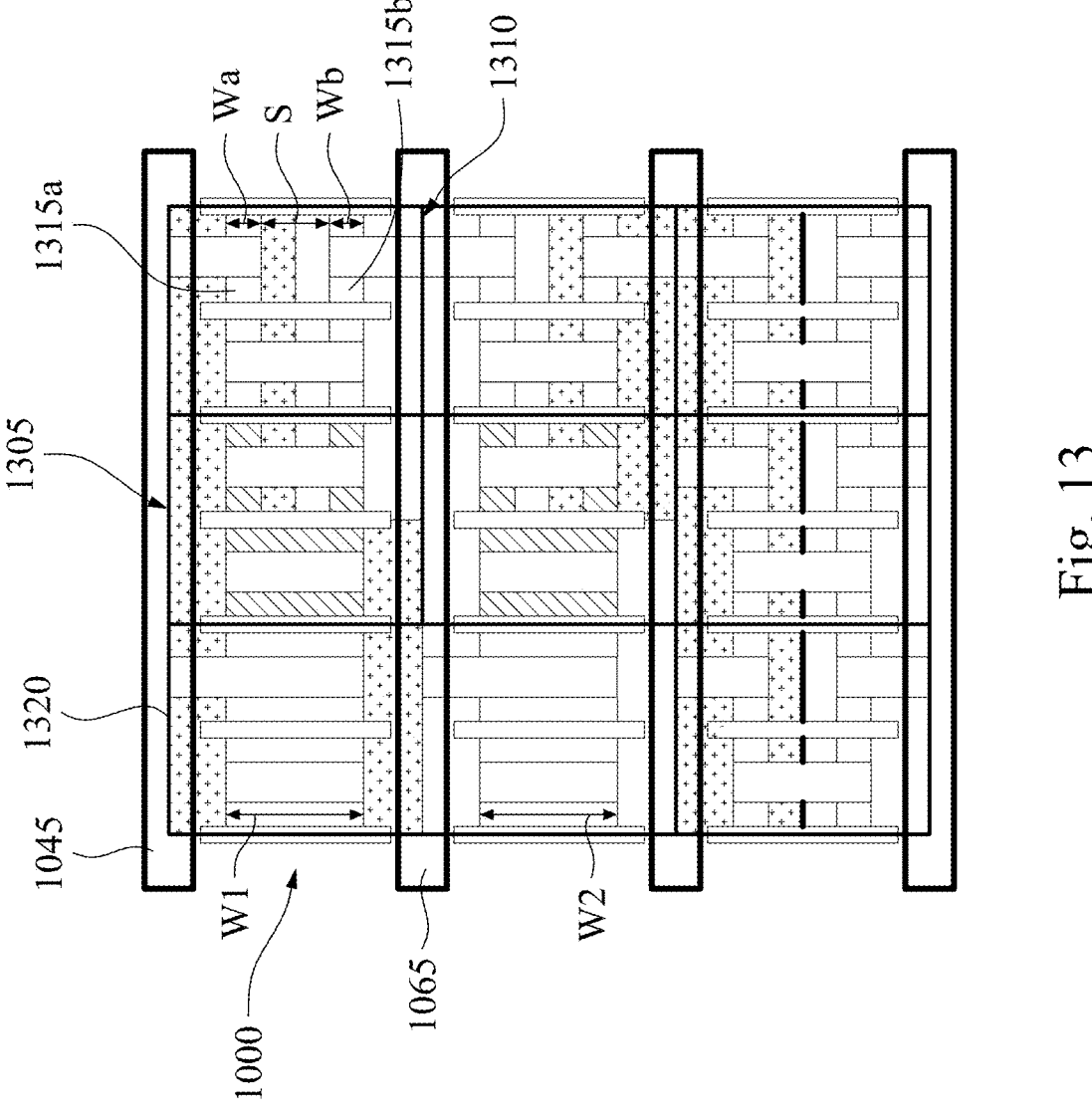
FIG. 13 is a view of a semiconductor device in accordance with some embodiments.

FIG. 13 is a view of a semiconductor device in accordance with some embodiments. The semiconductor device 1300 includes semiconductor device 1000 (FIG. 10). The semiconductor device 1300 further includes other devices in addition to the semiconductor device 1000. The semiconductor device 1300 includes a transition cell 1305 and a low power cell 1310. The cells within the semiconductor device 1300 are denoted by a cell boundary 1320, which one of ordinary skill in the art would recognize is not a physical structure. In some embodiments, the transition cell 1305 is similar to the transition cell 540 (FIG. 5). The semiconductor device 1000 is configured to have a same functionality as the low power cell 1310. However, the semiconductor device 1000 is configured to have a higher performance or larger current in comparison with the low power cell 1310. The difference in performance between the semiconductor device 900 and the low power cell 1310 is due to a size of the active regions in each of these components. By including both the semiconductor device 1000 and the low power cell 1310, the semiconductor device 1300 is able to achieve both low power consumption for portions of the semiconductor device 1300 while also providing high performance in portions of the semiconductor device 1300 based on design specifications.

The low power cell 1310 includes a first active region 1315a and a second active region 1315b. The first active region 1315a has a first width Wa. The second active region 1315b has a second width Wb. The first active region 1315a is separated from the second active region 1315b by a distance S. In contrast with the low power cell 1310, the each of the active regions in the semiconductor device 100 has a width equal to a sum of the first width Wa, the second width Wb, and the separation distance S. That is, W1=W2=Wa+Wb+S.

The semiconductor device 1300 includes a backside PDN including contact structures 1045 and 1065 extending through the substrate from an opposite side of the substrate from the transistor structures defined by the semiconductor device 100 and the low power cell 1310.

Figure 14:
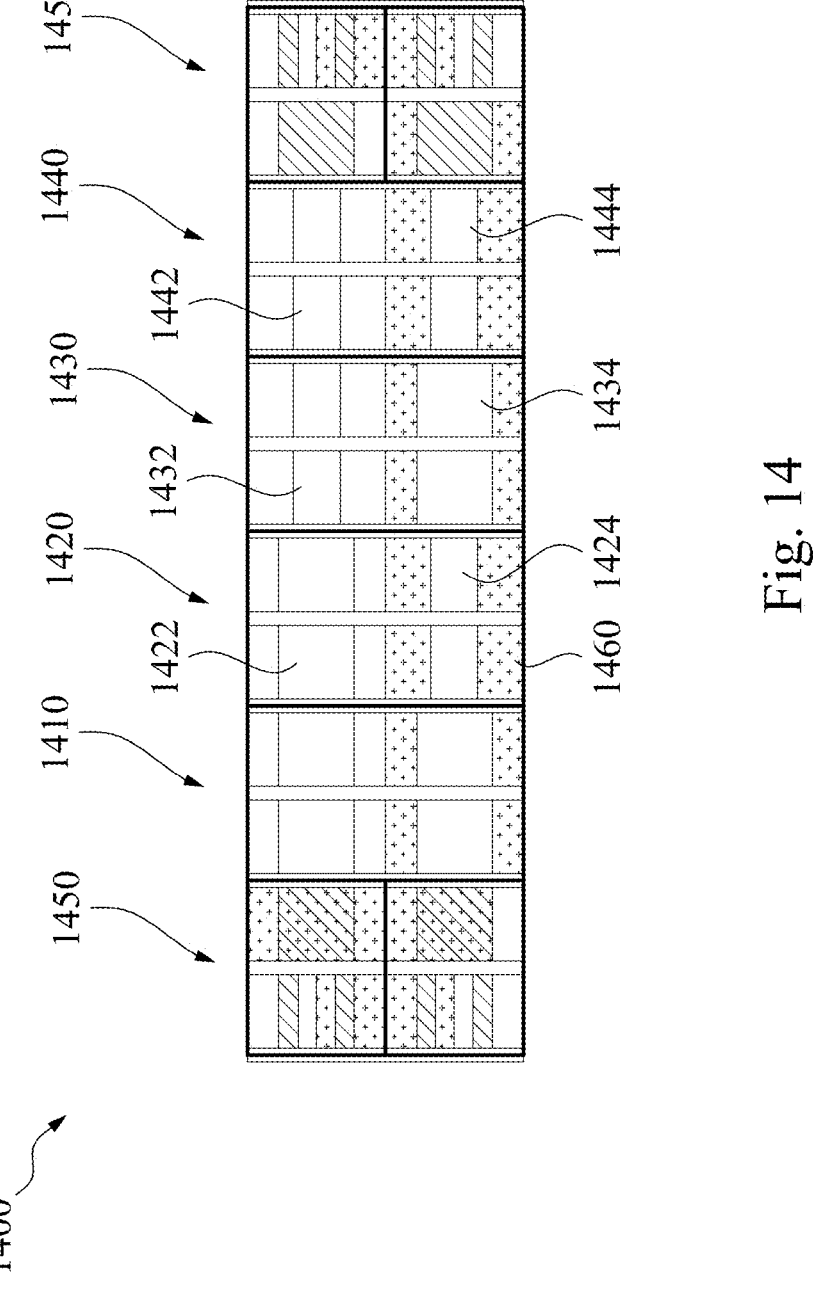
FIG. 14 is a view of cells of a semiconductor device layout in accordance with some embodiments.

FIG. 14 is a view of cells of a semiconductor device layout 1400 in accordance with some embodiments. The semiconductor device layout 1400 is similar to the semiconductor device layout 500 (FIG. 5). For the sake of brevity, some details of the semiconductor device layout 1400 are not repeated here. The semiconductor device layout 1400 includes a first cell 1410. In some embodiments, the first cell 1410 is similar to the first cell 510 (FIG. 5). The semiconductor device layout 1400 also includes transition cells 1450. In some embodiments, the transition cells 1450 are similar to the transition cell 540 (FIG. 5). The semiconductor device layout 1400 further includes an optional well 1460. In some embodiments, the optional well 1460 is similar to the optional well 560 (FIG. 5). In contrast with the semiconductor device layout 500 (FIG. 5), the semiconductor device layout 1400 includes a second cell 1420, a third cell 1430, and a fourth cell 1440, each of which have different combination of active region sizes in comparison with the first cell 1410 or the transition cells 1450.

The second cell 1420 includes a first active region 1422 having a first width equal to a width of the active regions in the first cell 1410. The second cell 1420 further includes a second active region 1424 having a second width. The second width is less than the first width, but greater than a width of the smaller active regions in the transition cells 1450. In some embodiments, the second width is called an intermediate width. In the second cell 1420, the second active region 1424 having the intermediate width is surrounded by the optional well 1460, in some embodiments.

The third cell 1430 includes a first active region 1432 having the intermediate width. The third cell 1430 further includes a second active region 1434 having the first width. In the third cell 1430, the first active region 1432 having the intermediate width is separated from the optional well 1460.

The fourth cell 1440 includes a first active region 1442 having the intermediate width. The fourth cell 1440 further includes a second active region 1444 having the intermediate width. In the second cell 1420, both the first active region 1442 and the second active region 1444 have the intermediate width.

The different active region widths of the semiconductor device layout 1400 provide different options for inclusion based on design specifications for a semiconductor device to be manufactured. Any of the first cell 1410, the second cell 1420, the third cell 1430, or the fourth cell 1440 are able to be included in other semiconductor device layouts, e.g., the semiconductor device layout 500 (FIG. 5). Utilizing the transition cells 1450 is performed as a way to shift between low power cells, e.g., low power cell 1110 (FIG. 11), and the higher performance cells like the first cell 1410, the second cell 1420, the third cell 1430, or the fourth cell 1440. For example, in a situation where a highest performance is desired for a specific component of the semiconductor device, the first cell 1410 would be usable. For a situation where a moderately improved performance is desired, then one of the second cell 1420, the third cell 1430, or the fourth cell 1440 would be usable. In some embodiments, a mixture of the first cell 1410, the second cell 1420, the third cell 1430, or the fourth cell 1440 is included in a same semiconductor device.

Figure 15:
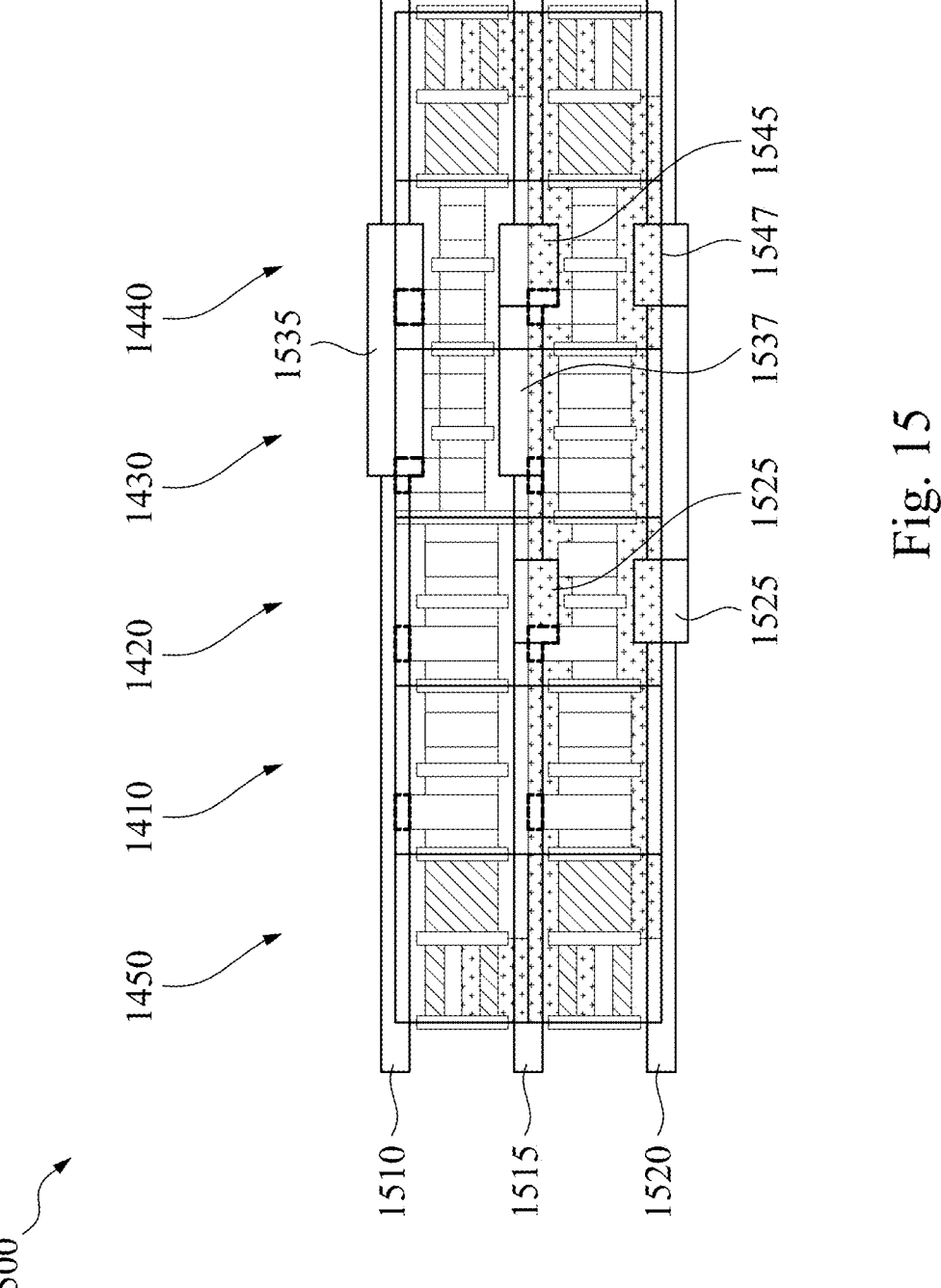
FIG. 15 is a view of cells of a semiconductor device in accordance with some embodiments.

FIG. 15 is a view of cells of a semiconductor device 1500 in accordance with some embodiments. The semiconductor device 1500 is similar to the semiconductor device layout 1400 (FIG. 14). For the sake of brevity details of components of the semiconductor device 1500 are not repeated here. In comparison with the semiconductor device layout 1400 (FIG. 14), the semiconductor device 1500 includes a first contact structure 1510, a second contact structure 1515, and a third contact structure 1520. In some embodiments, a structure of each of the first contact structure 1510, the second contact structure 1515, and the third contact structure 1520 is similar to a structure of the contact structure 430 (FIG. 4G-4N). Dimensions of the first contact structure 1510, the second contact structure 1515, and the third contact structure 1520 (collectively called contact structures 1510-1520) varies. Wider contact structures 1510-1520 reduces resistance for a current passing through a corresponding contact structure. Further, an increased interface between a corresponding contact structure of the contact structures 1510-1520 and a S/D contact reduces resistance for current passing through the interface.

In the first cell 1410 and in the transition cell 1450, a width of each of the contact structures 1510-1520 is equal and uniform across the cells. In the second cell 1420, a width of the first contact structure 1510 is uniform across the second cell 1420. In contrast to the first contact structure 1510, each of the second contact structure 1515 and the third contact structure 1520 has a wider region 1525 in a central portion of the corresponding cells. The wider region 1525 reduces resistance in comparison with other portions of the contact structures 1510-1520. In addition, the width of the second contact structure 1515 and the third contact structure 1520 varies across the second cell 1420.

In the third cell 1430, the first contact structure 1510 has a variable width and includes a wider region 1535. The second contact structure 1515 also has a variable width and a wider region 1537. The third contact structure 1520 has a uniform width across the third cell 1430. The wider region 1535 and the wider region 1537 reduces resistance in comparison with other portions of the contact structures 1510-1520.

In the fourth cell 1440, the first contact structure 1510 has a variable width and includes the wider region 1535. The second contact structure 1515 also has a variable width and the wider region 1537 as well as a wider region 1545. A width of the wider region 1545 is greater than a width of the wider region 1537. The third contact structure 1520 has a variable width across the third cell 1430 and a wider region 1547. The wider region 1535, the wider region 1537, the wider region 1545, and the wider region 1547 reduce resistance in comparison with other portions of the contact structures 1510-1520.

The various widths of the contact structures 1510-1520 in FIG. 15 are merely exemplary. One of ordinary skill in the art would understand that different width relationships are within the scope of this disclosure. In some embodiments, the widths of the contact structures 1510-1520 are selected based on a designed performance of a component of a semiconductor device. For example, in some embodiments, cells that are designed to have a higher performance include a wider contact structure in order to reduce resistance at the cell and improve current flow through the cell. In some embodiments, cells that are designed to have a lower power consumption will have a smaller width.

Figure 16:
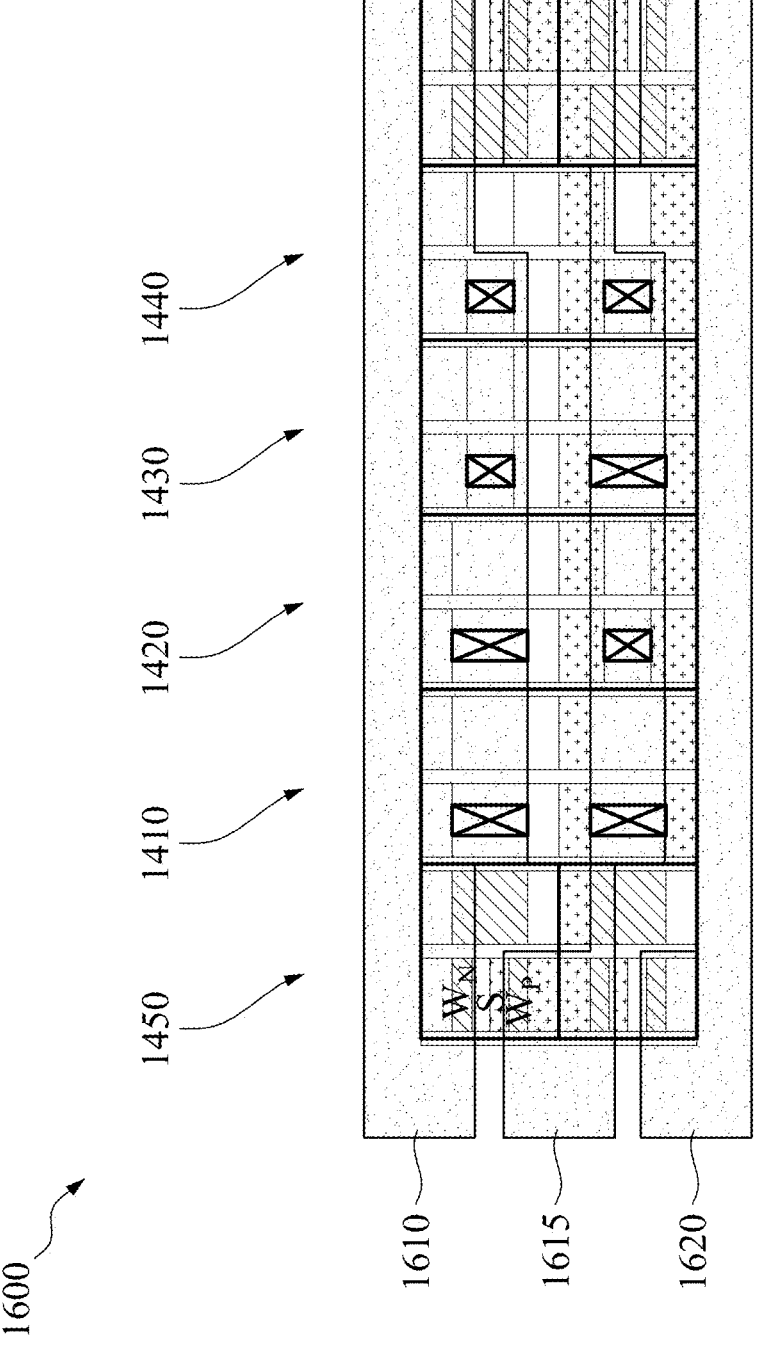
FIG. 16 is a view of cells of a semiconductor device in accordance with some embodiments.

FIG. 16 is a view of cells of a semiconductor device 1600 in accordance with some embodiments. The semiconductor device 1600 is similar to the semiconductor device layout 1400 (FIG. 14). For the sake of brevity details of components of the semiconductor device 1600 are not repeated here. In comparison with the semiconductor device layout 1400 (FIG. 14), the semiconductor device 1600 includes a first power rail 1610, a second power rail 1615, and a third power rail 1620. In some embodiments, a structure of each of the first power rail 1610, the second power rail 1615, and the third power rail 1620 is similar to a structure of the power rail 950 (FIG. 9). Dimensions of the first power rail 1610, the second power rail 1615, and the third power rail 1620 (collectively called power rails 1610-1620) varies. Wider power rails 1610-1620 reduce resistance for a current passing through a corresponding power rail. Further, an increased interface between a corresponding via structure and a corresponding power rail of the power rails 1610-1620 reduces resistance for current passing through the interface.

A width of the first power rail 1610 is uniform across the transition cells 1450. A width of the first power rail 1610 is also uniform across the first cell 1410, the second cell 1420, the third cell 1430, and the fourth cell 1440. The width of the first power rail 1610 across the transition cells 1450 is less than the width of the first power rail 1610 across the other cells 1410-1440.

A width of the second power rail 1615 is variable across the transition cells 1450. A width of the second power rail 1615 is also equal across the first cell 1410, the second cell 1420, the third cell 1430, and the fourth cell 1440. The width of the second power rail 1615 across a periphery portion of the transition cell 1450 is greater than the width of the second power rail 1615 across the other cells 1410-1440. The width of the second power rail 1615 across a portion of the transition cells 1450 closer to the other cells 1410-1440 is less than the width of the second power rail 1615 across the other cells 1410-1440.

The third power rail 1620 overlaps a portion of the transition cell 1450 in the bottom view of FIG. 16. However, the third power rail 1620 does not overlap the other cells 1410-1440 in the bottom view. A width of the third power rail 1620 bypassing the other cells 1410-1440 is less than a width of the power rail 1620 over a peripheral portion of the transition cell 1450. The third power rail 1620 also bypasses, does not overlap, a portion of the transition cell 1450 closes to the first cell 1410.

The various widths of the power rails 1610-1620 in FIG. 16 are merely exemplary. One of ordinary skill in the art would understand that different width relationships are within the scope of this disclosure. In some embodiments, the widths of the power rails 1610-1620 are selected based on a designed performance of a component of a semiconductor device. For example, in some embodiments, cells that are designed to have a higher performance include a wider power rail in order to reduce resistance at the cell and improve current flow through the cell. In some embodiments, cells that are designed to have a lower power consumption will have a smaller width for the power rails.

Figure 17:
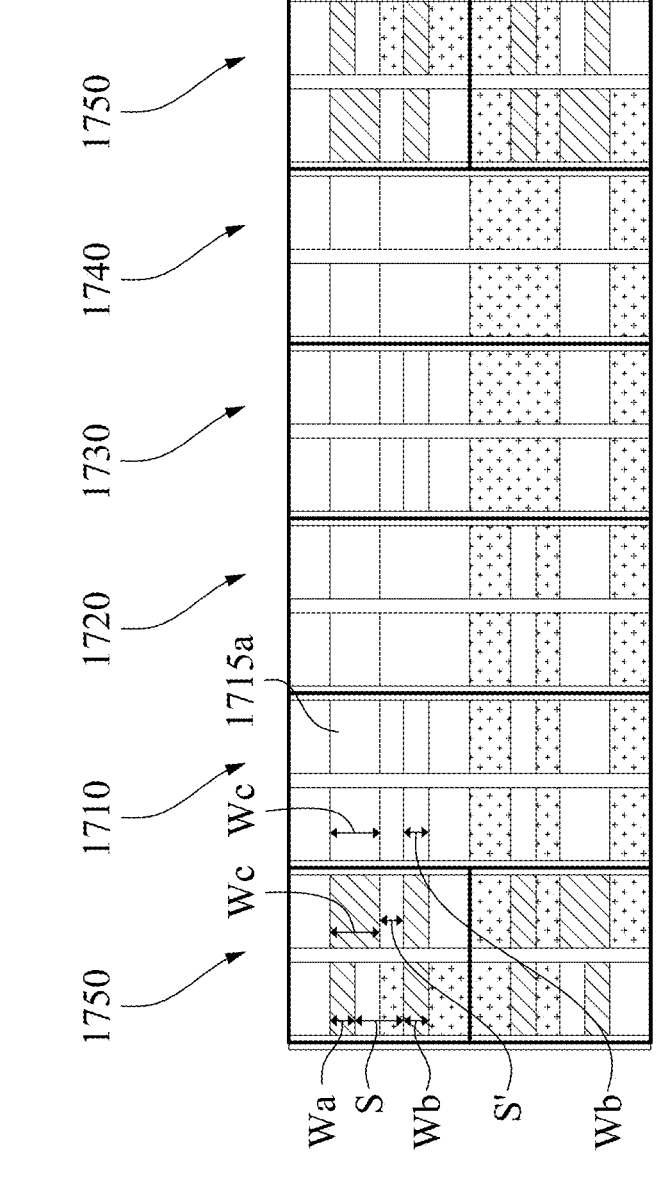
FIG. 17 is a view of cells of a semiconductor device layout in accordance with some embodiments.

FIG. 17 is a view of cells of a semiconductor device layout 1700 in accordance with some embodiments. The semiconductor device layout 1700 is similar to the semiconductor device layout 1400 (FIG. 14), so for the sake of brevity some elements of the semiconductor device layout 1700 are not described in detail. The semiconductor device layout 1700 includes transition cells 1750. The semiconductor device layout 1700 further includes a first cell 1710, a second cell 1720, a third cell 1730, and a fourth cell 1740. Active regions in a peripheral portion of the transition cells 1750 have the first width Wa and the second width Wb. The active regions in the peripheral portion of the transition cells 1750 are separated by the separation distance S. In contrast to the transition cell 1450 (FIG. 14), the transition cell 1750 includes multiple active regions in a portion of the transition cell 1750 closer to the first cell 1710. One of the active regions of the transition cell 1750 closer to the first cell 1710 maintains the second width Wb. Another of the active regions in the transition cell 1750 has a third width Wc. The third width Wc is greater than the first width Wa. In some embodiments, the third width Wc is equal to the intermediate width discussed above. A separation between the active regions in the portion of the transition cell 1750 closer to the first cell 1710 is a separation distance S', which is less than the separation distance S.

An upper portion of the first cell 1710 includes an active region 1715a having the third width Wc and an active region 1715b having the second width Wb. A lower portion of the first cell 1710 includes an active region having the third width Wc and an active region having the second width Wb.

An upper portion of the second cell 1720 includes an active region having the third width Wc, but no active region having the second width Wb. A lower portion of the second cell 1720 includes an active region having the third width Wc and an active region having the second width Wb.

An upper portion of the third cell 1730 includes an active region having the third width Wc and an active region having the second width Wb. A lower portion of the third cell 1730 includes an active region having the third width Wc, but no active region having the second width Wb.

An upper portion of the fourth cell 1740 includes an active region having the third width Wc, but no active region having the second width Wb. A lower portion of the fourth cell 1740 includes an active region having the third width Wc, but no active region having the second width Wb.

The different active region widths of the semiconductor device layout 1700 provide different options for inclusion based on design specifications for a semiconductor device to be manufactured. Any of the first cell 1710, the second cell 1720, the third cell 1730, or the fourth cell 1740 are able to be included in other semiconductor device layouts, e.g., the semiconductor device layout 500 (FIG. 5) or the semiconductor device layout 1400 (FIG. 14). Utilizing the transition cells 1750 is performed as a way to shift between low power cells, e.g., low power cell 1110 (FIG. 11), and the higher performance cells like the first cell 1710, the second cell 1720, the third cell 1730, or the fourth cell 1740. For example, in a situation where a highest performance is desired for a specific component of the semiconductor device, the first cell 1710 would be usable. For a situation where a moderately improved performance is desired, then one of the second cell 1720, the third cell 1730, or the fourth cell 1740 would be usable. In some embodiments, a mixture of the first cell 1710, the second cell 1720, the third cell 1730, or the fourth cell 1740 is included in a same semiconductor device.

Figure 18:
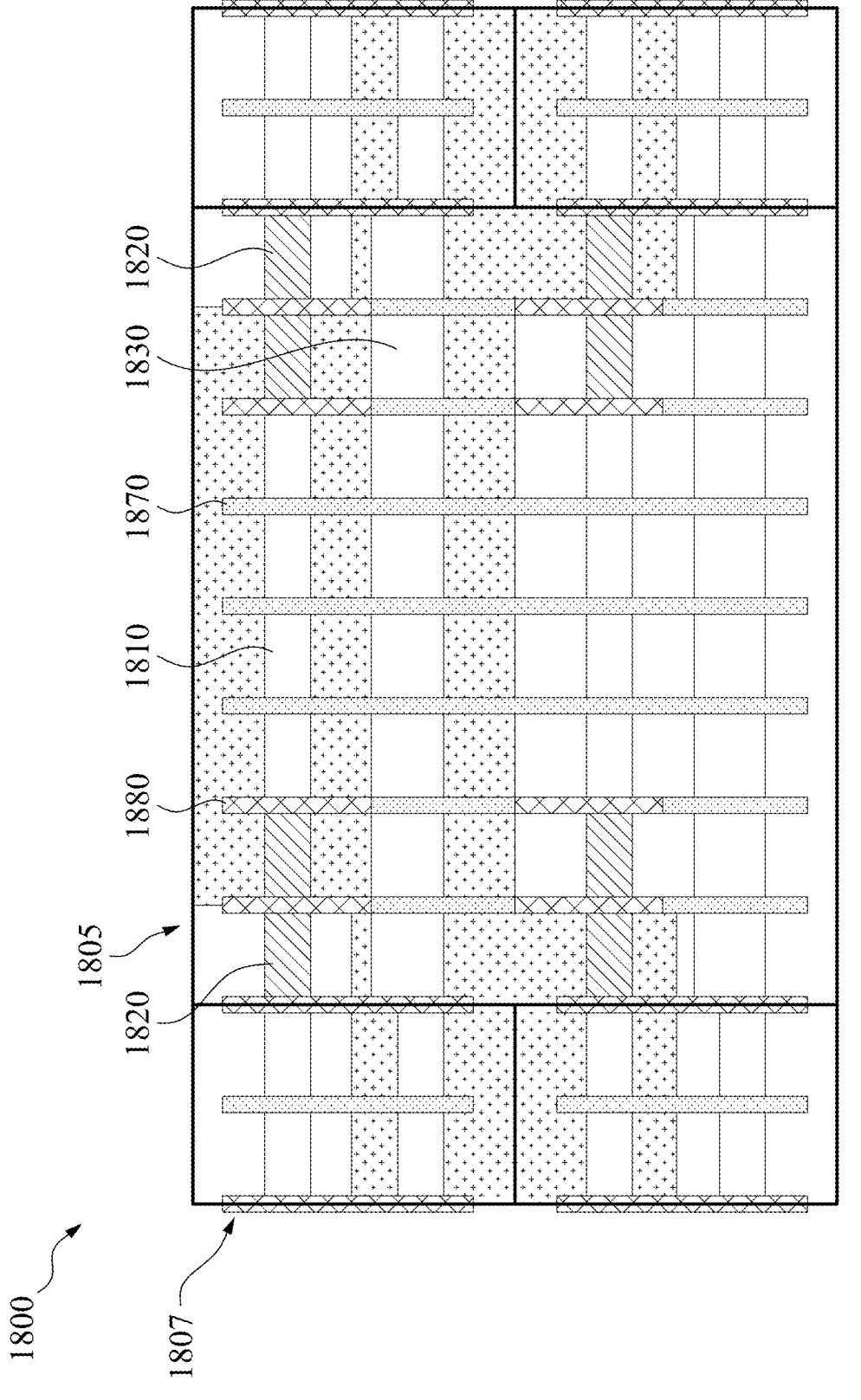
FIG. 18 is a view of cells of a semiconductor device layout in accordance with some embodiments.

FIG. 18 is a view of cells of a semiconductor device layout 1800 in accordance with some embodiments. The semiconductor device layout 1800 is similar to the semiconductor device layout 1700 (FIG. 17), the semiconductor device layout 1400 (FIG. 14), or the semiconductor device layout 500 (FIG. 5). For the sake of brevity some components of the semiconductor device layout 1800 are not described in detail. In contrast with the semiconductor device layout 1700 (FIG. 17), the semiconductor device layout 1400 (FIG. 14), and the semiconductor device layout 500 (FIG. 5), the semiconductor device layout 1800 does not include a transition cell. In place of a transition cell, a cell 1805 includes non-functional regions near a periphery of the cell 1805.

The semiconductor device layout 1800 includes a cell 1805 and a peripheral cell 1807. The cell 1805 includes an active region 1810 having a same width as an active region in the peripheral cell 1807, e.g., the second width Wb. The cell 1805 further includes an active region 1830 having a width, e, g., the third width Wc, greater than a width of an active region in the peripheral cell 1807.

The semiconductor device layout 1800 further includes functional gate structures 1870 and non-functional gate structure 1880. In some instances, the non-functional gate structures 1880 are also call dummy gate structures. All of the gate structures that cross the active region 1830 are functional gate structures 1870. Gate structures that cross a central portion of the active region 1810 are functional gate structures 1870. However, gate structures that cross peripheral portions 1820 of the active region 1810 are non-functional gate structures 1880. Additionally, gate structures along the boundary lines of the first cell 1805 are non-functional gate structures 1880.

Incorporating the non-functional regions in a periphery of the first cell 1805 helps to decrease overall semiconductor device size by reducing boundaries between cells, which reduces non-functional gate structures within the semiconductor device. One of ordinary skill in the art would understand that incorporating non-functional peripheral regions into cells having wider active regions is possible in other arrangements as well, such as the semiconductor device layout 1700 (FIG. 17), the semiconductor device layout 1400, or the semiconductor device layout 500 (FIG. 5).

An aspect of this description relates to a semiconductor device. The semiconductor device includes a first cell in a first row, wherein the first row extends in a first direction, the first cell having a first cell height measured in a second direction perpendicular to the first direction. The semiconductor device further includes a second cell in the first row, wherein the second cell has a second cell height measured in the second direction, the second cell height is less than the first cell height. The second cell includes a first active region having a first width measured in the second direction, and a second active region having a second width measured in the second direction, wherein the second width is different from the first width. In some embodiments, the first cell directly abuts the second cell. In some embodiments, the first cell comprises a third active region having the first width. In some embodiments, the third active region is aligned with the first active region. In some embodiments, an edge of the third active region is aligned with an edge of the second active region. In some embodiments, the second active region is farther from the first cell than the first active region. In some embodiments, the first cell height is twice the second cell height. In some embodiments, the semiconductor device further includes a source/drain (S/D) region electrically connected to the first active region. In some embodiments, the semiconductor device further includes a bottom isolation structure between the S/D region and a substrate. In some embodiments, the semiconductor device further includes a well in a substrate below the S/D region. In some embodiments, the semiconductor device further includes a front side power delivery network (PDN). In some embodiments, the semiconductor device further includes a backside PDN. In some embodiments, the semiconductor device further includes a via extending through a substrate, wherein the via electrically connects the backside PDN to the first active region. In some embodiments, the semiconductor device further includes a contact structure extending through a substrate, wherein the contact structure is electrically connected to the backside PDN, and the contact structure is aligned with a boundary of the first cell. In some embodiments, the first cell includes a third active region, the third active region comprises an S/D region, and the contact structure is electrically connected to the S/D region.

An aspect of this description relates to a semiconductor device. The semiconductor device includes a first cell in a first row, wherein the first row extends in a first direction, the first cell having a first cell height measured in a second direction perpendicular to the first direction, and the first cell comprises a first active region having a first width in the second direction. The semiconductor device further includes a second cell in the first row, wherein the second cell has a second cell height measured in the second direction, the second cell height is less than the first cell height. The second cell includes a second active region having the first width, and a third active region having a second width measured in the second direction, wherein the second width is different from the first width. The semiconductor device further includes a third cell in a second row, wherein the third cell comprises a fourth active region having the second width, and the third cell directly abuts the first cell. In some embodiments, the first active region comprises a plurality of nano-sheets. In some embodiments, the semiconductor device includes a contact structure extending through a substrate at an interface of the first cell and the third cell. In some embodiments, the semiconductor device further includes a substrate, wherein a dopant concentration of the substrate is uniform across an entirety of the substrate.

An aspect of this description relates to a semiconductor device. The semiconductor device includes a first cell in a first row, wherein the first row extends in a first direction, the first cell having a first cell height measured in a second direction perpendicular to the first direction. The first cell includes a first active region having a first width in the second direction, a second active region having the first width, and a well in a substrate below the second active region, wherein the substrate below the first active region is free of the well. The semiconductor device further includes a second cell in the first row, wherein the second cell has a second cell height measured in the second direction, the second cell height is less than the first cell height. The second cell includes a third active region having the first width, wherein the substrate below the third active region is free of the well, and a fourth active region having a second width measured in the second direction, wherein the second width is different from the first width, and the substrate below the fourth active region includes the well.

The foregoing outlines features of several embodiments so that those skilled in the art may better understand aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a first cell in a first row, wherein the first row extends in a first direction, the first cell having a first cell height measured in a second direction perpendicular to the first direction; and
a second cell in the first row, wherein the second cell has a second cell height measured in the second direction, the second cell height is less than the first cell height, and the second cell comprises:
a first active region having a first width measured in the second direction, and
a second active region having a second width measured in the second direction, wherein the second width is different from the first width.

2. The semiconductor device of claim 1, wherein the first cell directly abuts the second cell.

3. The semiconductor device of claim 1, wherein the first cell comprises a third active region having the first width.

4. The semiconductor device of claim 3, wherein the third active region is aligned with the first active region.

5. The semiconductor device of claim 3, wherein an edge of the third active region is aligned with an edge of the second active region.

6. The semiconductor device of claim 1, wherein the second active region is farther from the first cell than the first active region.

7. The semiconductor device of claim 1, wherein the first cell height is twice the second cell height.

8. The semiconductor device of claim 1, further comprising a source/drain (S/D) region electrically connected to the first active region.

9. The semiconductor device of claim 8, further comprising a bottom isolation structure between the S/D region and a substrate.

10. The semiconductor device of claim 8, further comprising a well in a substrate below the S/D region.

11. The semiconductor device of claim 1, further comprising a front side power delivery network (PDN).

12. The semiconductor device of claim 1, further comprising a backside PDN.

13. The semiconductor device of claim 12, further comprising a via extending through a substrate, wherein the via electrically connects the backside PDN to the first active region.

14. The semiconductor device of claim 12, further comprising a contact structure extending through a substrate, wherein the contact structure is electrically connected to the backside PDN, and the contact structure is aligned with a boundary of the first cell.

15. The semiconductor device of claim 14, wherein the first cell comprises a third active region, the third active region comprises an S/D region, and the contact structure is electrically connected to the S/D region.

16. A semiconductor device, comprising:
a first cell in a first row, wherein the first row extends in a first direction, the first cell having a first cell height measured in a second direction perpendicular to the first direction, and the first cell comprises a first active region having a first width in the second direction;
a second cell in the first row, wherein the second cell has a second cell height measured in the second direction, the second cell height is less than the first cell height, and the second cell comprises:
a second active region having the first width, and
a third active region having a second width measured in the second direction,
wherein the second width is different from the first width; and
a third cell in a second row, wherein the third cell comprises a fourth active region having the second width, and the third cell directly abuts the first cell.

17. The semiconductor device of claim 16, wherein the first active region comprises a plurality of nano-sheets.

18. The semiconductor device of claim 16, further comprising a contact structure extending through a substrate at an interface of the first cell and the third cell.

19. The semiconductor device of claim 16, further comprising a substrate, wherein a dopant concentration of the substrate is uniform across an entirety of the substrate.

20. A semiconductor device, comprising:
a first cell in a first row, wherein the first row extends in a first direction, the first cell having a first cell height measured in a second direction perpendicular to the first direction;
a second cell in the first row, wherein the second cell has a second cell height measured in the second direction, the second cell height is less than the first cell height, and the second cell comprises:
a first active region, in a substrate, having a first width measured in the second direction, and
a second active region, in the substrate, having a second width measured in the second direction, wherein the second width is different from the first width; and
a conductive contact structure extending through the substrate.

* * * * *